(12) United States Patent
Taira

(10) Patent No.: US 12,553,126 B2
(45) Date of Patent: Feb. 17, 2026

(54) METHOD OF FORMING FILM, METHOD OF MANUFACTURING SEMICONDUCTOR DEVICE, FILM FORMATION APPARATUS, AND RECORDING MEDIUM

(71) Applicant: Kokusai Electric Corporation, Tokyo (JP)

(72) Inventor: Yuki Taira, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/613,740

(22) Filed: Mar. 22, 2024

(65) Prior Publication Data

US 2024/0240308 A1 Jul. 18, 2024

Related U.S. Application Data

(63) Continuation of application No. PCT/JP2022/031010, filed on Aug. 17, 2022.

(30) Foreign Application Priority Data

Dec. 15, 2021 (JP) .................................. 2021-203542

(51) Int. Cl.
*C23C 16/34* (2006.01)
*C23C 16/44* (2006.01)
(Continued)

(52) U.S. Cl.
CPC ........ *C23C 16/345* (2013.01); *C23C 16/4408* (2013.01); *C23C 16/452* (2013.01); *C23C 16/45557* (2013.01); *H01L 21/0217* (2013.01)

(58) Field of Classification Search
CPC . C23C 16/345; C23C 16/4408; C23C 16/452; C23C 16/45557; C23C 16/4554;
(Continued)

(56) References Cited

U.S. PATENT DOCUMENTS

2006/0105106 A1 5/2006 Balseanu et al.
2013/0171838 A1 7/2013 Okuda
(Continued)

FOREIGN PATENT DOCUMENTS

JP 2008-522405 A 6/2008
JP 2013-093551 A 5/2013
(Continued)

OTHER PUBLICATIONS

Machine translation, JP-2019070182-A (Year: 2019).*
(Continued)

*Primary Examiner* — Michael G Miller
(74) *Attorney, Agent, or Firm* — Volpe Koenig

(57) ABSTRACT

There is provided a technique that includes: forming a nitride film on a substrate by performing a cycle a predetermined number of times, the cycle including: (a) supplying a precursor to the substrate; (b) supplying a nitriding agent to the substrate; and (c) supplying an active species X, which is generated by plasma-exciting an inert gas, to the substrate, wherein a stress of the nitride film is controlled to be between a tensile stress and a compressive stress or is controlled to be the compressive stress by controlling an amount of exposure of the active species X to a surface of the substrate in (c).

23 Claims, 9 Drawing Sheets

(51) Int. Cl.
*C23C 16/452* (2006.01)
*C23C 16/455* (2006.01)
*H01L 21/02* (2006.01)

(58) Field of Classification Search
CPC ........ C23C 16/45542; C23C 16/45546; C23C 16/45578; C23C 16/507; C23C 16/42; C23C 16/455; H01L 21/0217; H01L 21/0214; H01L 21/02211; H01L 21/0228; H01L 21/02274; H01L 21/31
See application file for complete search history.

(56) References Cited

U.S. PATENT DOCUMENTS

| | | |
|---|---|---|
| 2015/0004332 A1 | 1/2015 | Kato et al. |
| 2015/0101533 A1 | 4/2015 | Okuda |
| 2015/0249004 A1 | 9/2015 | Lee et al. |
| 2017/0271144 A1 | 9/2017 | Hashimoto et al. |
| 2020/0299839 A1 | 9/2020 | Yabe et al. |

FOREIGN PATENT DOCUMENTS

| | | | | |
|---|---|---|---|---|
| JP | 2015-012021 A | 1/2015 | | |
| JP | 2015-165564 A | 9/2015 | | |
| JP | 2017-063184 A | 3/2017 | | |
| JP | 2017-168786 A | 9/2017 | | |
| JP | 2019070182 A | * 5/2019 | ........... | C23C 16/405 |
| JP | 2020-155729 A | 9/2020 | | |
| KR | 10-2017-0034628 A | 3/2017 | | |
| TW | 201712143 A | 4/2017 | | |
| WO | WO-2020247548 A1 | * 12/2020 | ........... | C23C 16/401 |

OTHER PUBLICATIONS

Korean Office Action issued on Mar. 28, 2025 for Korean Patent Application No. 10-2024-7009675.
International Search Report, PCT/JP2022/031010, Oct. 18, 2022, 5 pgs.
Taiwan Office Action, Taiwan Paten Application No. 111138553, Sep. 20, 2023, 19 pgs.

* cited by examiner

METHOD OF FORMING FILM, METHOD OF MANUFACTURING SEMICONDUCTOR DEVICE, FILM FORMATION APPARATUS, AND RECORDING MEDIUM

CROSS-REFERENCE TO RELATED APPLICATION

This application is a Bypass Continuation application of PCT International Application No. PCT/JP2022/031010, filed on Aug. 17, 2022 and designating the United States, the international application being based upon and claiming the benefit of priority from Japanese Patent Application No. 2021-203542, filed on Dec. 15, 2021, the entire content of which is incorporated herein by reference.

TECHNICAL FIELD

The present disclosure relates to a method of forming a film, a method of manufacturing a semiconductor device, a film formation apparatus, and a recording medium.

BACKGROUND

In the related art, as a process of manufacturing a semiconductor device, a process of forming a nitride film on a surface of a surface may be often carried out.

As semiconductor devices become miniaturized and more highly integrated, high controllability of a stress of a nitride film is demanded.

SUMMARY

Some embodiments of the present disclosure provide a technique capable of improving a controllability of a stress of a nitride film.

According to embodiments of the present disclosure, there is provided a technique that includes: forming a nitride film on a substrate by performing a cycle a predetermined number of times, the cycle including: (a) supplying a precursor to the substrate; (b) supplying a nitriding agent to the substrate; and (c) supplying an active species X, which is generated by plasma-exciting an inert gas, to the substrate, wherein a stress of the nitride film is controlled to be between a tensile stress and a compressive stress or is controlled to be the compressive stress by controlling an amount of exposure of the active species X to a surface of the substrate in (c).

BRIEF DESCRIPTION OF DRAWINGS

The accompanying drawings, which are incorporated in and constitute a part of the present disclosure, illustrate embodiments of the present disclosure.

DETAILED DESCRIPTION

Figure 1:
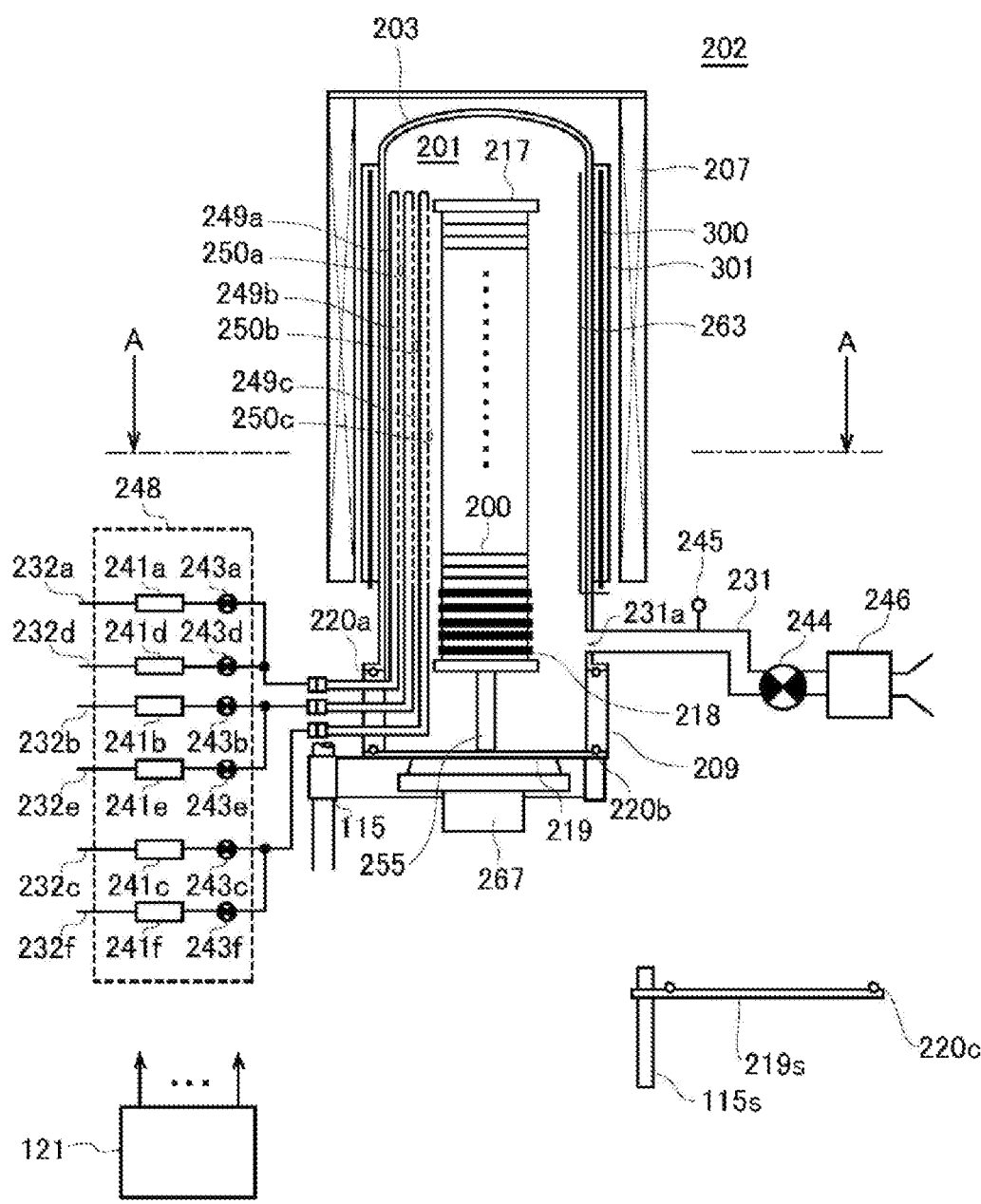
FIG. 1 is a schematic configuration view of a vertical process furnace of a film formation apparatus suitably used in embodiments of the present disclosure, in which a portion of the process furnace 202 is shown in a vertical cross section.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Some embodiments of the present disclosure will now be described mainly with reference to FIGS. 1 to 5. The drawings used in the following description are schematic, and dimensional relationships, ratios, and the like of various elements shown in the drawings may not match actual ones. Further, dimensional relationships, ratios, and the like of various elements among plural figures may not match one another.

(1) Configuration of Film Formation Apparatus

As shown in FIG. 1, a process furnace 202 of a film formation apparatus as a substrate processing apparatus includes a heater 207 as a temperature regulator (a heating part). The heater 207 is formed in a cylindrical shape and is supported by a support plate so as to be vertically installed. The heater 207 also functions as an activator (a thermal exciter) configured to thermally activate (excite) a gas.

A reaction tube 203 is disposed inside the heater 207 so as to be concentric with the heater 207. The reaction tube 203 is made of, for example, a heat resistant material such as quartz ($SiO_2$) or silicon carbide (SiC), and is formed in a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and is formed in a cylindrical shape with both of its upper and lower ends opened. The upper end of the manifold 209 engages with the lower end of the reaction tube 203 so as to support the reaction tube 203. An O-ring 220a serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical region of the process container. The process chamber 201 is configured to be capable of accommodating wafers 200 as substrates. Processing on the wafers 200 is performed in the process chamber 201, that is, the process container.

Nozzles 249a to 249c as first to third suppliers are installed in the process chamber 201 so as to penetrate a sidewall of the manifold 209. The nozzles 249a to 249c are also referred to as first to third nozzles, respectively. The nozzles 249a to 249c are made of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is provided in the vicinity of the nozzle 249b.

Mass flow controllers (MFCs) 241a to 241c, which are flow rate controllers (flow rate control parts), and valves 243a to 243c, which are opening/closing valves, are provided at the gas supply pipes 232a to 232c, respectively, sequentially from the upstream side of a gas flow. Gas supply pipes 232d to 232f are connected to the gas supply pipes 232a to 232c at the downstream side of the valves 243a to 243c, respectively. MFCs 241d to 241f and valves 243d to 243f are provided at the gas supply pipes 232d to 232f, respectively, sequentially from the upstream side of a gas flow. The gas supply pipes 232a to 232f are made of, for example, a metal material such as SUS.

Figure 2:
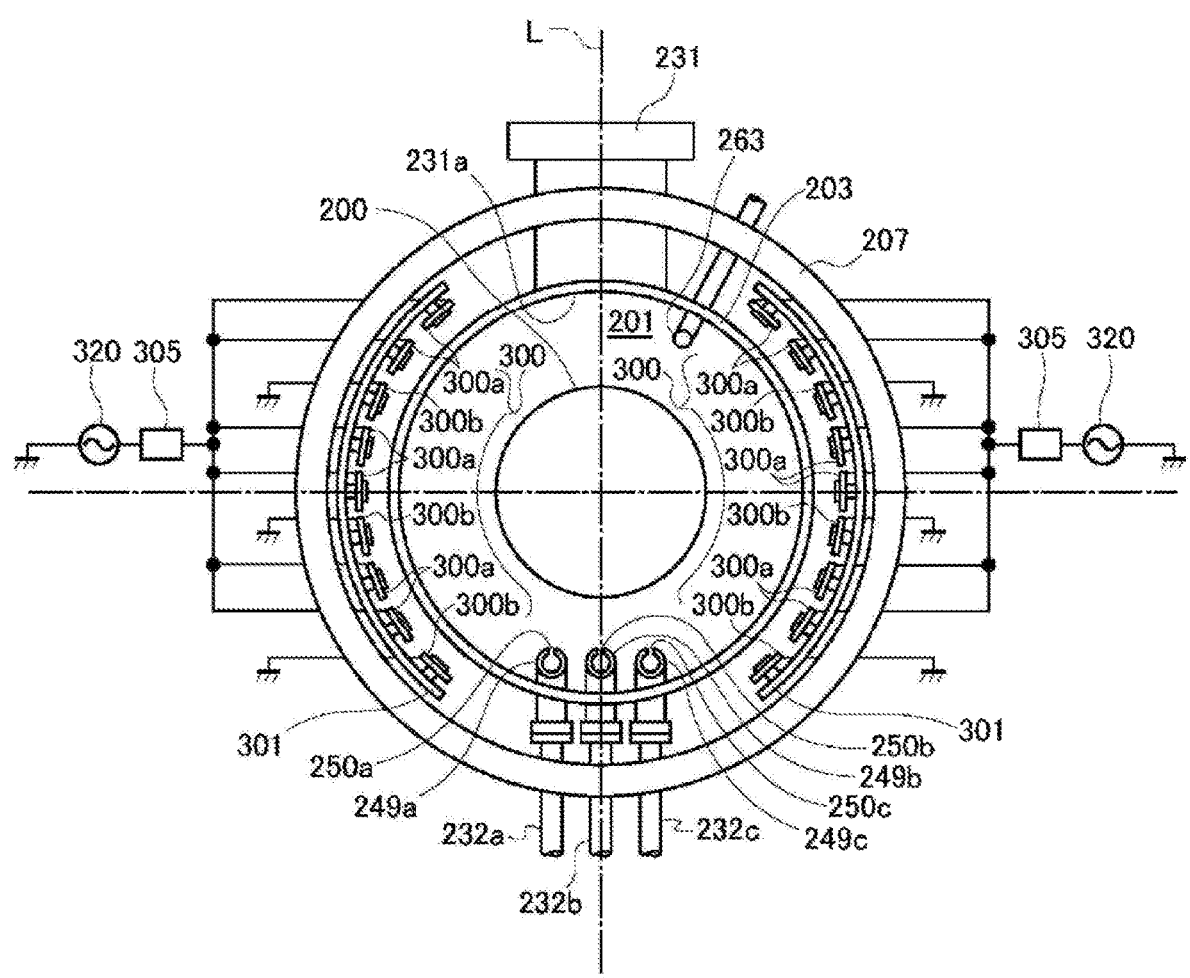
FIG. 2 is a schematic configuration view of the vertical process furnace of the film formation apparatus suitably used in the embodiments of the present disclosure, in which a portion of the process furnace 202 is shown in a cross section taken along line A-A in FIG. 1.

As shown in FIGS. 1 and 2, each of the nozzles 249a to 249c is installed in an annular space (in a plane view) between an inner wall of the reaction tube 203 and the wafers 200 so as to extend upward from a lower side to an upper side of the inner wall of the reaction tube 203, that is, along an arrangement direction of the wafers 200. Specifically, each of the nozzles 249a to 249c is provided at a region horizontally surrounding a wafer arrangement region in which the wafers 200 are arranged at a lateral side of the wafer arrangement region, along the wafer arrangement region. In the plane view, the nozzle 249b is disposed to face an exhaust port 231a to be described later on a straight line across the centers of the wafers 200 loaded into the process chamber 201, which are interposed therebetween. The nozzles 249a and 249c are arranged to sandwich a straight line L passing through the nozzle 249b and the center of the exhaust port 231a from both sides along the inner wall of the reaction tube 203 (outer peripheries of the wafers 200). The straight line L is also a straight line passing through the nozzle 249b and the centers of the wafers 200. That is, it may be said that the nozzle 249c is installed on the opposite side of the nozzle 249a with the straight line L interposed therebetween. The nozzles 249a and 249c are arranged in line symmetry, that is, line-symmetrically, with the straight line L as an axis of symmetry. Gas supply holes 250a to 250c configured to supply a gas are formed on side surfaces of the nozzles 249a to 249c, respectively. Each of the gas supply holes 250a to 250c is opened to oppose (face) the exhaust port 231a in a plane view, which enables a gas to be supplied toward the wafers 200. A plurality of gas supply holes 250a to 250c are formed from the lower side to the upper side of the reaction tube 203.

A precursor (precursor gas) is supplied from the gas supply pipe 232a into the process chamber 201 via the MFC 241a, the valve 243a, and the nozzle 249a.

A nitriding agent (nitriding gas or nitrogen source) as a reactant (reaction gas) is supplied from the gas supply pipe 232b into the process chamber 201 via the MFC 241b, the valve 243b, and the nozzle 249b.

An oxidizing agent (oxidizing gas or oxygen source) as a reactant (reaction gas) is supplied from the gas supply pipe 232c into the process chamber 201 via the MFC 241c, the valve 243c, and the nozzle 249c.

An inert gas is supplied from the gas supply pipes 232d to 232f into the process chamber 201 via the MFCs 241d to 241f, the valves 243d to 243f, the gas supply pipes 232a to 232c, and the nozzles 249a to 249c, respectively. The inert gas acts as a purge gas, a carrier gas, a dilution gas, or the like. As will be described later, the inert gas may be supplied by being plasma-excited within the process chamber 201. In such a case the inert gas may also act as a modifying gas.

A precursor supply system (precursor gas supply system) mainly includes the gas supply pipe 232a, the MFC 241a, and the valve 243a. A nitriding agent supply system (nitriding source supply system or nitriding gas supply system) mainly includes the gas supply pipe 232b, the MFC 241b, and the valve 243b. An oxidizing agent supply system (oxidizing source supply system or oxidizing gas supply system) mainly includes the gas supply pipe 232c, the MFC 241c, and the valve 243c. At least one selected from the group of the nitriding agent supply system and the oxidizing agent supply system may also be referred to as a reactant supply system. An inert gas supply system mainly includes the gas supply pipes 232d to 232f, the MFCs 241d to 241f, and the valves 243d to 243f. As mentioned above, when the inert gas acts as the modifying gas, the inert gas supply system may also be referred to as a modifying gas supply system.

One or the entirety of the above-described various gas supply systems may be configured as an integrated gas supply system 248 in which the valves 243a to 243f, the MFCs 241a to 241f, and so on are integrated. The integrated gas supply system 248 is connected to each of the gas supply pipes 232a to 232f, and configured such that operations of supplying various gases into the gas supply pipes 232a to 232f (that is, an opening/closing operation of the valves 243a to 243f, a flow rate regulation operation by the MFCs 241a to 241f, and the like) are controlled by a controller 121 which will be described later. The integrated gas supply system 248 is configured as an integral type or division type integrated unit, and may be attached to or detached from the gas supply pipes 232a to 232f and the like on an integrated unit basis, such that maintenance, replacement, extension, etc. of the integrated gas supply system 248 may be performed on an integrated unit basis.

The exhaust port 231a configured to exhaust an internal atmosphere of the process chamber 201 is provided at a lower side of the sidewall of the reaction tube 203. As shown in FIG. 2, in a plane view, the exhaust port 231a is provided at a position opposing (facing) the nozzles 249a to 249c (the gas supply holes 250a to 250c) with the wafers 200 interposed therebetween. The exhaust port 231a may be provided from the lower side to the upper side of the sidewall of the reaction tube 203, that is, along the wafer arrangement region. An exhaust pipe 231 is connected to the exhaust port 231a. The exhaust pipe 231 is made of, for example, a metal material such as SUS. A vacuum pump 246 as a vacuum exhauster is connected to the exhaust pipe 231 via a pressure sensor 245 as a pressure detector (pressure detection part) configured to detect an internal pressure of the process chamber 201 and an auto pressure controller (APC) valve 244 as a pressure regulator (pressure regulation part). The APC valve 244 is configured to be capable of performing or stopping a vacuum exhaust operation in the process chamber 201 by opening or closing the valve while the vacuum pump 246 is actuated, and is also configured to be capable of regulating the internal pressure of the process chamber 201 by adjusting an opening state of the valve based on pressure information detected by the pressure sensor 245 while the vacuum pump 246 is actuated. The APC valve 244 may also be referred to as an exhaust valve. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is provided under the manifold 209. The seal cap 219 is made of, for example, a metal material such as SUS, and is formed in a disc shape. An O-ring 220b, which is a seal making contact with the lower end of the manifold 209, is provided at an upper surface of the seal cap 219. A rotator 267 configured to rotate a boat 217, which will be described later, is installed under the seal cap 219. A rotary shaft 255 of the rotator 267 is made of, for example, a metal material such as SUS, and is connected to the boat 217 through the seal cap 219. The rotator 267 is configured to rotate the wafers 200 by rotating the boat 217. The seal cap 219 is configured to be vertically moved up or down by a boat elevator 115 which is an elevator installed outside the reaction tube 203. The boat elevator 115 is configured as a transporter (transport equipment) configured to load or unload (transport) the wafers 200 into or out of the process chamber 201 by moving the seal cap 219 up or down.

A shutter 219s, which serves as a furnace opening lid configured to be capable of hermetically sealing a lower end opening of the manifold 209 in a state where the seal cap 219 is lowered and the boat 217 is unloaded from the process chamber 201, is provided under the manifold 209. The shutter 219s is made of, for example, a metal material such as SUS, and is formed in a disc shape. An O-ring 220c, which is a seal making contact with the lower end of the manifold 209, is provided at an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the plurality wafers 200 to be spaced apart from each other in the horizontal posture and along the vertical direction. The boat 217 is made of, for example, a heat resistant material such as quartz or SiC. Heat insulating plates 218 made of, for example, a heat resistant material such as quartz or SiC are installed below the boat 217 in multiple stages. The boat 217 is configured to be capable of supporting the plurality of wafers 200, respectively.

A temperature sensor 263 serving as a temperature detector is installed in the reaction tube 203. Based on temperature information detected by the temperature sensor 263, a state of supplying electric power to the heater 207 is regulated such that a temperature distribution inside the process chamber 201 becomes a desired temperature distribution. The temperature sensor 263 is provided along the inner wall of the reaction tube 203.

An electrode 300 for plasma generation is provided outside the reaction tube 203, that is, outside the process container (the process chamber 201). By applying electric power to the electrode 300, it becomes possible to excite a gas by turning the gas into plasma, that is, to plasma-excite the gas, inside the reaction tube 203, that is, inside the process container (the process chamber 201). Hereinafter, plasma-excitation of a gas will also be simply referred to as plasma-excitation. The electrode 300 is configured to apply electric power, that is, radio frequency power (RF power), to generate capacitively-coupled plasma (abbreviation: CCP) in the reaction tube 203, that is, in the process chamber (the process chamber 201).

Specifically, as shown in FIG. 2, the electrode 300 and an electrode fixture 301 configured to fix the electrode 300 are arranged between the heater 207 and the reaction tube 203. The electrode fixture 301 is disposed inside the heater 207, the electrode 300 is disposed inside the electrode fixture 301, and the reaction tube 203 is disposed inside the electrode 300.

Further, as shown in FIGS. 1 and 2, the electrode 300 and the electrode fixture 301 are provided to extend in the arrangement direction of the wafers 200 from a lower side to an upper side of an outer wall of the reaction tube 203 in an annular space (in a plane view) between the inner wall of the heater 207 and the outer wall of the reaction tube 203. The electrode 300 is provided in parallel to the nozzles 249a to 249c. The electrode 300 and the electrode fixture 301 are disposed to be arranged in a concentric arc shape with the reaction tube 203 and the heater 207 and in a non-contact manner with the reaction tube 203 and the heater 207 in a plane view. Since the electrode fixture 301 is made of an insulating material (insulator) and is provided to cover the electrode 300 and at least a portion of the reaction tube 203, the electrode fixture 301 may also be referred to as a cover (insulating cover, insulating wall, or insulating plate) or an arc-shaped cross-sectional cover (arc-shaped cross-sectional body or arc-shaped cross-sectional wall).

Figure 4:
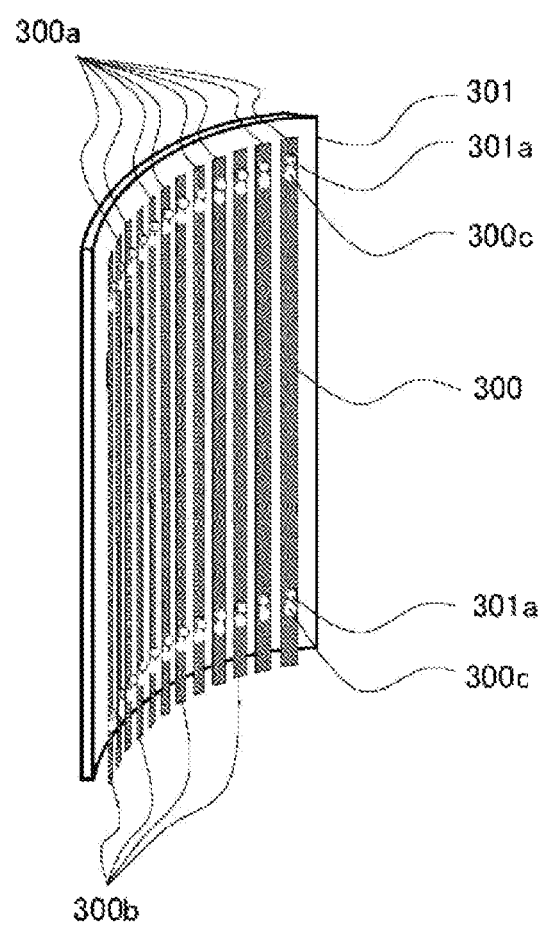
FIG. 4 is a schematic configuration view of an electrode unit in the film formation apparatus suitably used in the embodiments of the present disclosure and is a perspective view of the electrode unit.

As shown in FIG. 2, a plurality of electrodes 300 are provided, and these plurality of electrodes 300 are fixed on an inner wall of the electrode fixture 301. More specifically, as shown in FIG. 4, a protrusion (hook) 301a on which the electrode 300 may be hooked is provided at the inner wall surface of the electrode fixture 301, and an opening 300c, which is a through-hole through which the protrusion 301a may be inserted, is provided at the electrode 300. The electrode 300 may be fixed to the electrode fixture 301 by hooking the electrode 300 onto the protrusion 301a provided at the inner wall surface of the electrode fixture 301 through the opening 300c. FIG. 4 shows an example in which two openings 300c are formed for one electrode 300 and one electrode 300 is fixed by being hooked on two protrusions 301a, that is, one electrode 300 is fixed at two locations. FIG. 2 shows an example in which nine electrodes 300 are fixed to one electrode fixture 301, and FIG. 4 shows an example in which 12 electrodes 300 are fixed to one electrode fixture 301.

Each electrode 300 is made of an oxidation resistant material such as nickel (Ni). Although the electrode 300 may be made of a metal material such as SUS, aluminum (Al), or copper (Cu), the electrode 300 may be made of an oxidation resistant material such as Ni, deterioration of electrical conductivity may be suppressed and a decrease in plasma generation efficiency may be suppressed. Further, the electrode 300 may be made of a Ni alloy material to which Al is added, in which case an aluminum oxide film (AlO film), which is an oxide film with high heat resistance and corrosion resistance, may be formed on the outermost surface of the electrode 300. The AlO film formed on the outermost surface of the electrode 300 acts as a protective film (block film or barrier film), and may suppress the progress of deterioration inside the electrode 300. This makes it possible to further suppress a decrease in plasma generation efficiency due to a decrease in electrical conductivity of the electrode 300. The electrode fixture 301 is made of an insulating material (insulator), for example, a heat resistant material such as quartz or SiC. The material of the electrode fixture 301 may be the same as the material of the reaction tube 203.

As shown in FIG. 2, the electrode 300 includes a first electrode 300a and a second electrode 300b. The first electrode 300a is connected to a radio frequency power supply (RF power supply) 320 via a matcher 305. The second electrode 300b is grounded to be a reference potential (0V). The first electrode 300a is also referred to as a Hot electrode or HOT electrode, and the second electrode 300b is also referred to as a Ground electrode or a GND electrode. The first electrode 300a and the second electrode 300b are each configured as a plate-like member of a rectangular shape when viewed from the front. At least one first electrode 300a is provided, and at least one second electrode 300b is provided. FIGS. 1, 2, and 4 show examples in which a plurality of first electrodes 300a and a plurality of second electrodes 300b are provided. FIG. 2 shows an example in which six first electrodes 300a and three second electrodes 300b are installed for one electrode fixture 301, and FIG. 4 shows an example in which eight first electrodes 300a and four second electrodes 300b are installed for one electrode fixture 301. By applying RF power between the first electrode 300a and the second electrode 300b from the RF power supply 320 via the matcher 305, plasma is generated in a region between the first electrode 300a and the second electrode 300b. This region is also referred to as a plasma generation region.

A surface area of the first electrode 300a may be two times or more and three times or less than a surface area of the second electrode 300b. In a case where the surface area of the first electrode 300a is less than two times the surface area of the second electrode 300b, a spread of potential distribution becomes narrow such that a plasma generation efficiency may decrease. In a case where the surface area of the first electrode 300a exceeds three times the surface area of the second electrode 300b, the spread of the potential distribution may reach the edges of the wafers 200 such that the wafers 200 may become obstacles and the plasma generation efficiency may become saturated. Further, in such a case, discharging may also occur at the edges of the wafers 200, causing plasma damage to the wafers 200. By setting the surface area of the first electrode 300a to two times or more and three times or less the surface area of the second electrode 300b, it is possible to increase the plasma generation efficiency and suppress the plasma damage to the wafers 200. As shown in FIG. 2, the electrodes 300 (the first electrode 300a and the second electrode 300b) are arranged in an arc shape in a plane view, and are arranged at regular intervals, that is, such that distances (gaps) between adjacent electrodes 300 (the first electrode 300a and the second electrode 300b) are equal. Further, as described above, the electrodes 300 (the first electrode 300a and the second electrode 300b) are installed in parallel with the nozzles 249a to 249c.

Here, the electrode fixture 301 and the electrodes 300 (the first electrode 300a and the second electrode 300b) may also be referred to as an electrode unit. As shown in FIG. 2, the electrode unit may be arranged at a position avoiding the nozzles 249a to 249c, the temperature sensor 263, the exhaust port 231a, and the exhaust pipe 231. FIG. 2 shows an example in which two electrode units are arranged to oppose (face) each other with the center of the wafer 200 (the reaction tube 203) interposed therebetween, avoiding the nozzles 249a to 249c, the temperature sensor 263, the exhaust port 231a, and the exhaust pipe 231. FIG. 2 also shows an example in which two electrode units are arranged in line symmetry, that is, line-symmetrically, with the straight line L as the axis of symmetry in a plane view. By arranging the electrode units in this manner, it is possible to arrange the nozzles 249a to 249c, the temperature sensor 263, the exhaust port 231a, and the exhaust pipe 231 outside the plasma generation region in the process chamber 201, making it possible to suppress plasma damage to these members, wear and tear of these members, and generation of particles from these members.

The electrodes 300, that is, the first electrode 300a and the second electrode 300b, mainly constitutes an exciter (plasma exciter or plasma activator) configured to plasma-excite (activate) a gas. The electrode fixture 301, the matcher 305, and the RF power supply 320 may be included in the plasma exciter.

Figure 3:
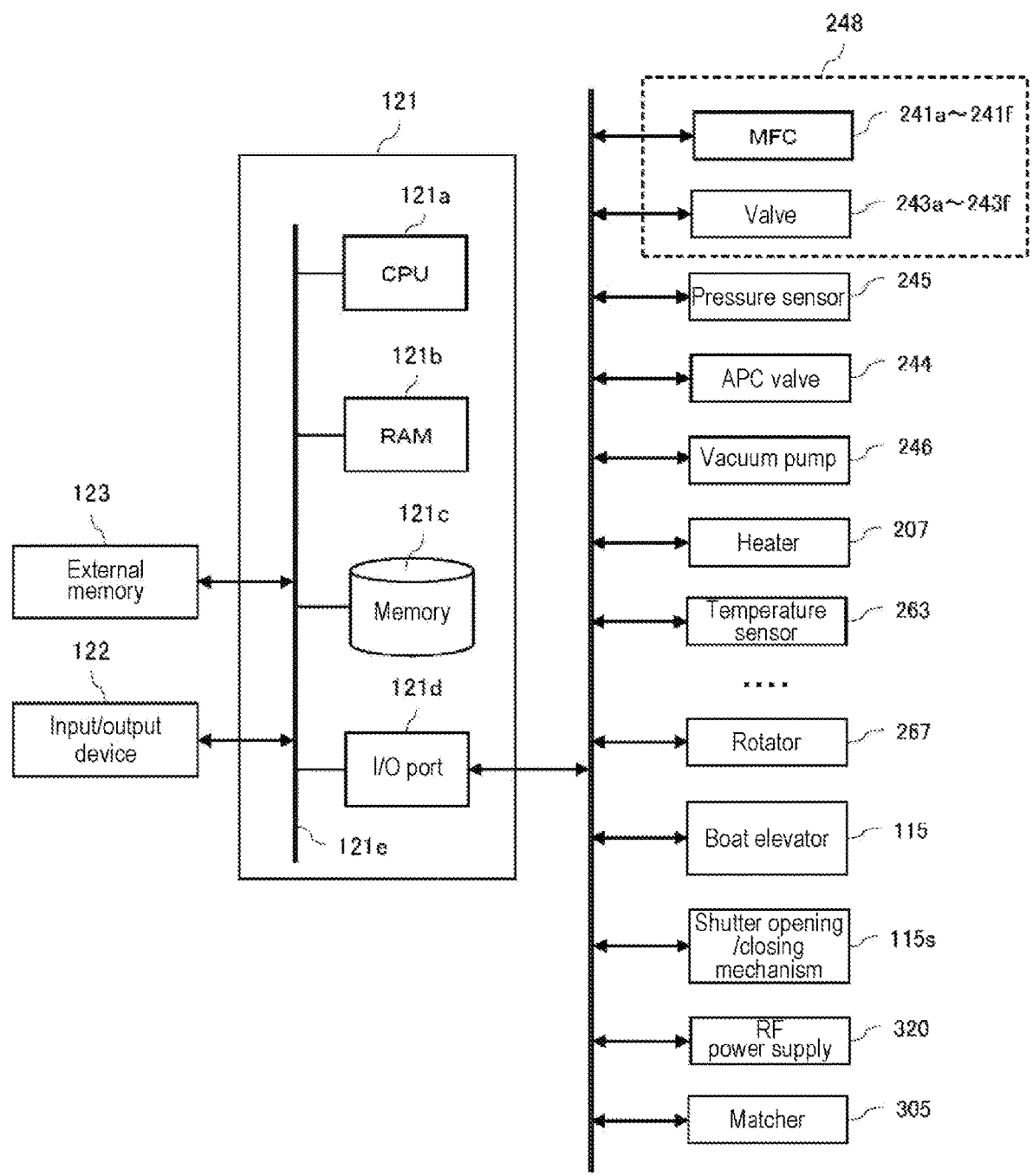
FIG. 3 is a schematic configuration diagram of a controller 121 of the film formation apparatus suitably used in the embodiments of the present disclosure, in which a control system of the controller 121 is shown in a block diagram.

As shown in FIG. 3, a controller 121, which is a control part (control means or unit), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 including, e.g., a touch panel or the like is connected to the controller 121. Further, an external memory 123 may be connected to the controller 121.

The memory 121c includes, for example, a flash memory, a hard disk drive (HDD), a solid state drive (SSD), or the like. A control program that controls operations of a film formation apparatus, a process recipe in which sequences and conditions of processes to be described later are written, etc. are readably recorded and stored in the memory 121c. The process recipe functions as a program that causes, by the controller 121, the film formation apparatus to execute each sequence in the processes, which will be described later, to obtain an expected result. Hereinafter, the process recipe and the control program may be generally and simply referred to as a "program." Further, the process recipe may be simply referred to as a "recipe." When the term "program" is used herein, it may indicate a case of including the recipe, a case of including the control program, or a case of including both the recipe and the control program. The RAM 121b is configured as a memory area (work area) in which programs or data read by the CPU 121a are temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotator 267, the boat elevator 115, the shutter opening/closing mechanism 115s, the RF power supply 320, the matcher 305, and so on.

The CPU 121a is configured to read and execute the control program from the memory 121c. The CPU 121a is also configured to be capable of reading the recipe from the memory 121c according to an input of an operation command from the input/output device 122. The CPU 121a is configured to be capable of controlling flow rate regulating operations of various kinds of gases by the MFCs 241a to 241f, opening/closing operations of the valves 243a to 243f, an opening/closing operation of the APC valve 244, a pressure regulating operation performed by the APC valve 244 based on the pressure sensor 245, actuating and stopping operations of the vacuum pump 246, a temperature regulating operation performed by the heater 207 based on the temperature sensor 263, operations of rotating the boat 217 with the rotator 267 and adjusting a rotation speed of the boat 217, an operation of moving the boat 217 up or down by the boat elevator 115, an opening/closing operation of the shutter 219s by the shutter opening/closing mechanism 115s, an impedance regulating operation by the matcher 305, supply of electrical power to the RF power supply 320, and so on, according to contents of the read recipe.

The controller 121 may be configured by installing, on the computer, the aforementioned program recorded and stored in the external memory 123. Examples of the external memory 123 may include a magnetic disk such as a HDD, an optical disc such as a CD, a magneto-optical disc such as a MO, a semiconductor memory such as a USB memory or a SSD, and the like. The memory 121c or the external memory 123 is configured as a computer-readable recording medium. Hereinafter, the memory 121c and the external memory 123 may be generally and simply referred to as a "recording medium," When the term "recording medium" is used herein, it may indicate a case of including the memory 121c, a case of including the external memory 123, or a case of including both the memory 121c and the external memory 123. Further, the program may be provided to the computer by using communication means or unit such as the Internet or a dedicated line, instead of using the external memory 123.

(2) Film-Forming Process

As a process of manufacturing a semiconductor device by using the above-described film formation apparatus, an example of a processing sequence of forming a nitride film on a wafer 200 as a substrate, that is, a film-forming sequence, will be described. In the following descriptions, operations of the respective components constituting the film formation apparatus are controlled by the controller 121.

Figure 5:
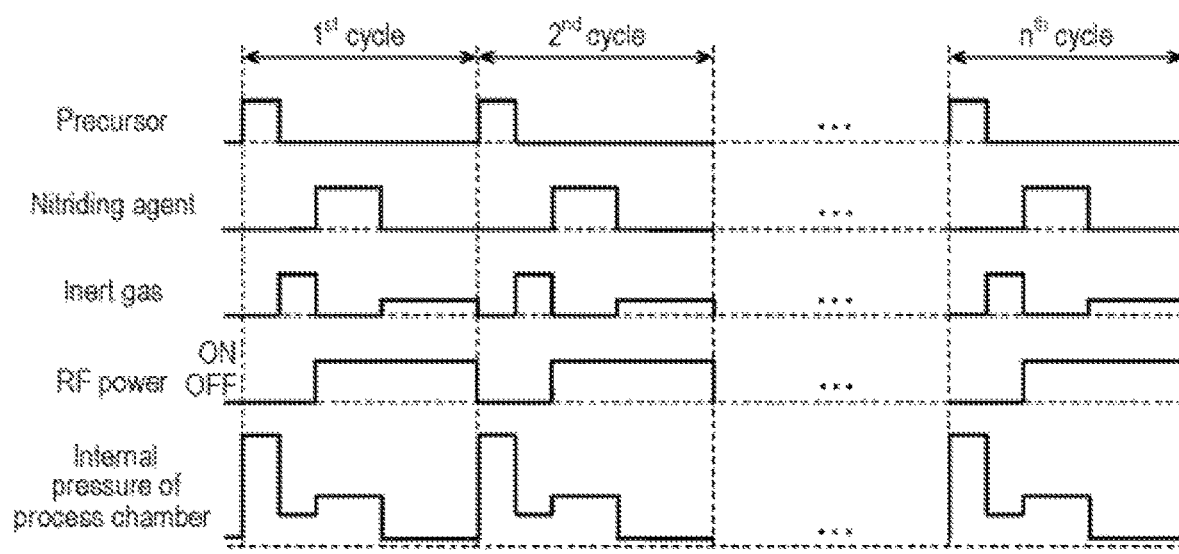
FIG. 5 is a diagram showing an example of a processing sequence in the embodiments of the present disclosure.

A processing sequence in the embodiments of the present disclosure shown in FIG. 5 includes:
 a step of forming a nitride film on a wafer 200 by performing a cycle a predetermined number of times (n times, where n is an integer of 1 or more), the cycle non-simultaneously performing:
  (a) a step of supplying a precursor to the wafer 200 in a process container;
  (b) a step of supplying a nitriding agent to the wafer 200 in the process container; and
  (c) a step of supplying an active species X, which is generated by plasma-exciting an inert gas, to the wafer 200 in the process container,
 wherein a stress of the nitride film is controlled to be between a tensile stress and a compressive stress or is controlled to be the compressive stress by controlling an amount of exposure of the active species X to a surface of the wafer 200 in (c).

The processing sequence shown in FIG. 5 also shows an example in which an active species Y generated by plasma-exciting the nitriding agent are supplied to the wafer 200 in (b).

In the present disclosure, for the sake of convenience, the above-described processing sequence (gas supply sequence) may also be denoted as follows. The same notation is also used in the description of other embodiments and modifications to be described later.

(Precursor ⟶ Plasma-excited nitriding agent ⟶

Plasma-excited inert gas) × n

The processing sequence shown in FIG. 5 shows an example in which a cycle of performing (a), (b), and (c) in this order is performed a plurality of times (n times). In this case, n is an integer of 2 or more. FIG. 5 also shows an example in which a space (the interior of the process container) where the wafer 200 is placed is purged with an inert gas after performing (a) and before performing (b). Further, after performing (b) and before performing (c), the interior of the process container may be purged with an inert gas in a non-plasma atmosphere. Further, when performing the cycle a plurality of times, after performing (c) and before performing (a), the interior of the process container may be purged with an inert gas in a non-plasma atmosphere. By using at least one of these configurations, it is possible to suppress mixing of gases in a plasma state within the process container, unintended reactions resulting from the mixing, generation of particles, and the like. These processing sequences may be shown as follows. Below, a purge performed in a non-plasma atmosphere is indicated by P.

(Precursor ⟶ P ⟶ Plasma-excited nitriding agent ⟶

Plasma-excited inert gas) × n (Precursor ⟶ P ⟶ Plasma-excited nitriding agent ⟶

P ⟶ Plasma-excited inert gas) × n (Precursor ⟶ P ⟶ Plasma-excited nitriding agent ⟶

Plasma-excited inert gas ⟶ P) × n (Precursor ⟶ P ⟶ Plasma-excited nitriding agent ⟶

P ⟶ Plasma-excited inert gas ⟶ P) × n

The nitride film in the present disclosure includes a silicon nitride film (SiN film) and a nitride film containing carbon (C) and oxygen (O). That is, the nitride film includes a silicon nitride film (SiN film), a silicon carbonitride film (SiCN film), a silicon oxynitride film (SiON film), a silicon oxycarbonitride film (SiOCN film), and the like. An example in which a SiN film is formed as the nitride film will be described below.

When the term "wafer" is used in the present disclosure, it may refer to "a wafer itself" or "a stacked body of a wafer and certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging)

The boat 217 is charged with a plurality of wafers 200 (wafer charging). Thereafter, the shutter 219s is moved by the shutter opening/closing mechanism 115s and the lower end opening of the manifold 209 is opened (shutter open). The wafers 200 include product wafers and dummy wafers.

(Boat Loading)

Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220b.

(Pressure Regulation and Temperature Regulation)

After the boat loading is completed, the interior of the process chamber 201, that is, a space where the wafers 200 are placed, is vacuum-exhausted (decompression-exhausted) by the vacuum pump 246 to reach a desired pressure (state of vacuum). In this operation, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to reach a desired processing temperature. At this time, a state of supplying electric power to the heater 207 is feedback-controlled based on the temperature information detected by the temperature sensor 263 such that a temperature distribution inside the process chamber 201 becomes a desired temperature distribution (temperature regulation). Further, the rotation of the wafers 200 by the rotator 267 is started. The exhaust of the interior of the process chamber 201 and the heating and rotation of the wafers 200 are continuously performed at least until the processing on the wafers 200 is completed.

(Film-Forming Process)

Thereafter, the following steps 1, 2, and 3 are performed in sequence.

[Step 1]

In step 1, a precursor is supplied to the wafer 200 in the process chamber 201.

Specifically, the valve 243a is opened to allow the precursor to flow through the gas supply pipe 232a. A flow rate of the precursor is regulated by the MFC 241a, and the precursor is supplied into the process chamber 201 via the nozzle 249a and is exhausted via the exhaust port 231a. In this operation, the precursor is supplied to the wafer 200 from the lateral side of the wafer 200 (supply of precursor). At this time, the valves 243d to 243f may be opened to allow an inert gas to be supplied into the process chamber 201 via the nozzles 249a to 249c, respectively.

A processing condition in this step is exemplified as follows:

Processing temperature: 250 to 550 degrees C., specifically 400 to 500 degrees C.
Processing pressure: 100 to 4,000 Pa, specifically 100 to 1,000 Pa
Supply flow rate of precursor gas: 0.1 to 3 slm
Supply time of precursor gas: 1 to 100 seconds, specifically 1 to 30 seconds
Supply flow rate of Inert gas (for each gas supply pipe): 0 to 10 slm In the present disclosure, notation of a numerical range such as "250 to 550 degrees C." means that a lower limit value and an upper limit value are included in that range. Therefore, for example, "250 to 550 degrees C." means "250 degrees C. or higher and 550 degrees C. or lower." The same applies to other numerical ranges. In the present disclosure, the processing temperature means the temperature of the wafer 200 or the internal temperature of the process chamber 201, and the processing pressure means the internal pressure of the process chamber 201. Further, when the flow rate of gas supply is 0 slm, it means a case where no gas is supplied. The same applies to the following description.

By supplying, for example, a chlorosilane-based gas as the precursor to the wafer 200 under the aforementioned processing condition, a Si-containing layer containing Cl is formed on the outermost surface of the wafer 200 as a base. The Si-containing layer containing Cl is formed by physical adsorption or chemical adsorption of molecules of the chlorosilane-based gas, physical adsorption or chemical adsorption of molecules of a substance obtained by partially decomposing the chlorosilane-based gas, deposition of Si due to thermal decomposition of the chlorosilane-based gas, or the like on the outermost surface of the wafer 200. The Si-containing layer containing Cl may be an adsorption layer (physical adsorption layer or chemical adsorption layer) of molecules of the chlorosilane-based gas or molecules of the substance obtained by partially decomposing the chlorosilane-based gas, or a Si deposition layer containing Cl. In the present disclosure, the Si-containing layer containing Cl is also simply referred to as a Si-containing layer. Under the aforementioned process condition, the physical adsorption or chemical adsorption of molecules of the chlorosilane-based gas or molecules of the substance obtained by partially decomposing the chlorosilane-based gas on the outermost surface of the wafer 200 occurs predominantly (preferentially), and the deposition of Si due to the thermal decomposition of the chlorosilane-based gas occurs slightly or rarely. That is, under the aforementioned processing condition, the Si-containing layer includes an overwhelmingly large amount of adsorption layer (physical adsorption layer and chemical adsorption layer) of molecules of the chlorosilane-based gas and molecules of the substance obtained by partially decomposing the chlorosilane-based gas, and includes a slight or rare amount of Si deposition layer containing Cl.

After the Si-containing layer is formed, the valve 243a is closed to stop the supply of the precursor into the process chamber 201. Then, the interior of the process chamber 201 is vacuum-exhausted to remove a gas and the like remaining in the process chamber 201 from the process chamber 201 (purging). At this time, the valves 243d to 243f are opened to allow an inert gas to be supplied into the process chamber 201. The inert gas acts as a purge gas. The interior of the process chamber 201 is purged under a non-plasma atmosphere. As a result, it is possible to suppress mixing of the precursor remaining in the process chamber 201 with the nitriding agent supplied into the process chamber 201 in step 2, unintended reactions (e.g., gas phase reaction and plasma vapor phase reaction) resulting from the mixing, and generation of particles, and the like.

A processing condition for purging is exemplified as follows:

Processing temperature: 250 to 550 degrees C., specifically 400 to 500 degrees C.
Processing pressure: 1 to 20 Pa
Supply flow rate of inert gas (for each gas supply pipe): 0.05 to 20 slm
Supply time of Inert gas: 1 to 200 seconds, specifically 1 to 40 seconds As the precursor, for example, a silane-based gas containing silicon (Si) as the main element constituting a film formed on the wafer 200 may be used. As the silane-based gas, for example, a gas containing halogen and Si, that is, a halosilane-based gas, may be used. The halogen includes chlorine (Cl), fluorine (F), bromine (Br), iodine (I), and the like. As the halosilane-based gas, for example, the above-mentioned chlorosilane-based gas containing Cl and Si may be used.

Examples of the precursor may include chlorosilane-based gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: 4CS) gas, a hexachlorodisilane ($Si_2Cl_6$, abbreviation: HCDS) gas, and an octachlorotrisilane ($Si_3Cl_8$, abbreviation: OCTS) gas. One or more of these gases may be used as the precursor.

In addition to the chlorosilane-based gases, examples of the precursor may also include fluorosilane-based gases such as a tetrafluorosilane ($SiF_4$) gas and a difluorosilane ($SiH_2F_2$) gas, bromosilane-based gases such as a tetrabromosilane ($SiBr_4$) gas and a dibromosilane ($SiH_2Br_2$) gas, and iodosilane-based gases such as a tetraiodosilane ($SiI_4$) gas and a diiodosilane ($SiH_2I_2$) gas. One or more of these gases may be used as the precursor.

In addition to these gases, for example, a gas containing an amino group and Si, that is, an aminosilane-based gas may also be used as the precursor. The amino group is a monovalent functional group obtained by removing hydrogen (H) from ammonia, a primary amine, or a secondary amine, and may be expressed as $—NH_2$, $—NHR$, or $—NR_2$. Note that R may represent an alkyl group and the two R's in $—NR_2$ may be the same or different.

Examples of the precursor may include aminosilane-based gases such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tert-butylamino)silane ($SiH_2[NH(C_4H_9)]_2$, abbreviation: BTBAS) gas, and a (diisopropylamino)silane ($SiH_3[N(C_3H_7)_2]$, abbreviation: DIPAS) gas. One or more of these gases may be used as the precursor.

Examples of the inert gas may include a nitrogen ($N_2$) gas and rare gases such as an argon (Ar) gas, a helium (He) gas, a neon (Ne) gas, a xenon (Xe) gas, a krypton (Kr) gas, and a radon (Rn). One or more of these gases may be used as the inert gas. The same applies to each step to be described below.

[Step 2]

After step 1 is completed, a nitriding agent is plasma-excited and supplied to the wafer 200 in the process chamber 201, that is, the Si-containing layer formed on the wafer 200.

Specifically, the valve 243b is opened to allow the nitriding agent to flow through the gas supply pipe 232b. A flow rate of the nitriding agent is regulated by the MFC 241b, and the nitriding agent is supplied into the process chamber 201 via the nozzle 249b and is exhausted via the exhaust port 231a. In this operation, the nitriding agent is supplied to the wafer 200 from the lateral side of the wafer 200 (supply of nitriding agent). At this time, the valves 243d to 243f may be opened to allow an inert gas to be supplied into the process chamber 201 via the nozzles 249a to 249c, respectively.

Further, at this time, by applying RF power between the first electrode 300a and the second electrode 300b, plasma is generated in a region between the first electrode 300a and the second electrode 300b. As a result, the nitriding agent may be plasma-excited, and an active species Y generated by plasma-exciting the nitriding agent is supplied to the wafer 200 (supply of plasma-excited nitriding agent). At this time, the nitriding agent containing the active species Y is supplied to the wafer 200.

When using, for example, a gas containing nitrogen (N) and hydrogen (H) as the nitriding agent, the N- and H-containing gas is plasma-excited to form an active species Y such as $NHx*$ (x is an integer of 1 to 3) to be supplied to the wafer 200 (supply of plasma-excited N- and H-containing gas). In this case, the N- and H-containing gas containing the active species Y such as $NH*$, $NH_2*$, and $NH_3*$ is supplied to the wafer 200. Note that * means radicals. The same applies to the following description.

Before the nitriding agent is plasma-excited and supplied to the wafer 200, a period during which the nitriding agent is supplied without being plasma-excited may be provided. That is, before the plasma-excited nitriding agent is supplied to the wafer 200, a non-plasma-excited nitriding agent may be supplied to the wafer 200, that is, the non-plasma-excited nitriding agent may pre-flow (non-plasma-excited nitriding agent pre-flow). In this case, first, the nitriding agent is supplied without being plasma-excited, and after a predetermined period of time elapses, the RF power may be applied between the first electrode 300a and the second electrode 300b while continuing to supply the nitriding agent. This makes it possible to generate more stable plasma and active species.

A processing condition in this step is exemplified as follows:

Processing temperature: 250 to 550 degrees C., specifically 400 to 500 degrees C.
Processing pressure: 2 to 100 Pa, specifically 20 to 70 Pa
Supply flow rate of nitriding agent: 0.1 to 10 slm
Supply time of nitriding agent: 10 to 200 seconds, specifically 1 to 50 seconds
Supply flow rate of inert gas (for each gas supply pipe): 0 to 10 slm
RF power: 100 to 1,000 W
RF frequency: 13.56 MHz or 27 MHz At least a portion of the Si-containing layer formed on the wafer 200 is nitrided (modified) by plasma-exciting and supplying the nitriding agent to the wafer 200 under the aforementioned processing condition. As a result, a silicon nitride layer (SiN layer) is formed as a layer containing Si and N on the outermost surface of the wafer 200 as a base. When forming the SiN layer, impurities such as Cl contained in the Si-containing layer form a gaseous substance containing at least Cl in the process of a modification reaction of the Si-containing layer by the plasma-excited nitriding agent and are discharged from the process chamber 201. As a result, the SiN layer becomes a layer containing fewer impurities such as Cl than the Si-containing layer formed in step 1.

After the SiN layer is formed, the valve 243b is closed to stop the supply of the nitriding agent into the process chamber 201. Thereafter, step 3 is performed, but before that, the interior of the process chamber 201 may be purged under a non-plasma atmosphere. In this case, a gas and the like remaining in the process chamber 201 may be removed from the process chamber 201 (purging) according to the same processing procedure as the purging in step 1. As a result, it is possible to suppress mixing of the plasma-excited nitriding agent remaining in the process chamber 201 with the plasma-excited inert gas supplied into the process chamber 201 in step 3, unintended reactions (e.g., plasma vapor phase reaction) resulting from the mixing, and generation of particles, and the like.

As the nitriding agent, for example, a gas containing nitrogen (N) and hydrogen (H) may be used. The N- and H-containing gas is both an N-containing gas and an H-containing gas. Specifically, the nitriding agent may contain a N—H bond.

As the nitriding agent, for example, hydrogen nitride-based gases such as an ammonia ($NH_3$) gas, a diazene ($N_2H_2$) gas, a hydrazine ($N_2H_4$) gas, and a $N_3H_8$ gas may be used. One or more of these gases may be used as the nitriding agent.

In addition to these gases, for example, a nitrogen (N)-, carbon (C)-, and hydrogen (H)-containing gas may also be used as the nitriding agent. As the N-, C- and H-containing gas, for example, an amine-based gas or an organic hydrazine-based gas may be used. The N-, C-, and H-containing gas is a N-containing gas, a C-containing gas, a H-containing gas, and a N- and C-containing gas.

Examples of the nitriding agent may include ethylamine-based gases such as a monoethylamine ($C_2H_5NH_2$, abbreviation: MEA) gas, a diethylamine (($C_2H_5$)$_2$NH, abbreviation: DEA) gas, and a triethylamine (($C_2H_5$)$_3$N, abbreviation: TEA) gas, methylamine-based gases such as a monomethylamine ($CH_3NH_2$, abbreviation: MMA) gas, a dimethylamine (($CH_3$)$_2$NH, abbreviation: DMA) gas, and a trimethylamine (($CH_3$)$_3$N, abbreviation: TMA) gas, organic hydrazine-based gases such as monomethylhydrazine (($CH_3$)$HN_2H_2$, abbreviation: MMH) gas, a dimethylhydrazine (($CH_3$)$_2N_2H_2$, abbreviation: DMH) gas, and a trimethylhydrazine (($CH_3$)$_2N_2(CH_3)H$, abbreviation: TMH) gas, and the like. One or more of these gases may be used as the nitriding agent.

[Step 3]

After step 2 is completed, an inert gas is plasma-excited and supplied to the wafer 200 in the process chamber 201, that is, the SiN layer formed on the wafer 200.

Specifically, the valves 243d to 243f are opened to allow an inert gas to flow into the gas supply pipes 232d to 232f, respectively. A flow rate of the inert gas is regulated by the MFCs 241d to 241f, respectively and the inert gas is supplied into the process chamber 201 via the nozzles 249a to 249c respectively and is exhausted via the exhaust port 231a. In this operation, the inert gas is supplied to the wafer 200 from the lateral side of the wafer 200 (supply of inert gas).

At this time, by applying RF power between the first electrode 300a and the second electrode 300b, plasma is generated in the region between the first electrode 300a and the second electrode 300b. As a result, the inert gas may be plasma-excited, and an active species X generated by plasma-exciting the inert gas is supplied to the wafer 200 (supply of plasma-excited inert gas). At this time, the inert gas containing the active species X is supplied to the wafer 200.

When using, for example, a $N_2$ gas as the inert gas, the $N_2$ gas is plasma-excited to form an active species X such as Nx* (x is an integer of 1 and 2) to be supplied to the wafer 200 (supply of plasma-excited $N_2$ gas). In this case, the $N_2$ gas containing the active species X such as N* and $N_2$* is supplied to the wafer 200.

When using, for example, an Ar gas as the inert gas, the Ar gas is plasma-excited to generate an active species X such as Ar* to be supplied to the wafer 200 (supply of plasma-excited Ar gas). In this case, the Ar gas containing the active species X such as Ar* is supplied to the wafer 200.

When using, for example, a He gas as the inert gas, the He gas is plasma-excited to generate an active species X such as He* to be supplied to the wafer 200 (supply of plasma-excited He gas). At this time, the He gas containing the active species X such as He* is supplied to the wafer 200.

As the inert gas, a mixed gas obtained by mixing these gases in the process chamber 201 may also be used. For example, as the inert gas, a mixed gas of $N_2$ gas and Ar gas, a mixed gas of $N_2$ gas and He gas, or a mixed gas of $N_2$ gas, Ar gas, and He gas may also be used.

Before the inert gas is plasma-excited and supplied to the wafer 200, a period during which the inert gas is supplied without being plasma-excited may be provided. That is, before the plasma-excited inert gas is supplied to the wafer 200, a non-plasma-excited inert gas may be supplied to the wafer 200, that is, the non-plasma-excited inert gas may pre-flow (non-plasma-excited inert gas pre-flow). In this case, first, the inert gas is supplied without being plasma-excited, and after a predetermined period of time elapses, the RF power may be applied between the first electrode 300a and the second electrode 300b while continuing to supply the inert gas. This makes it possible to generate more stable plasma and active species.

A process condition in this step is exemplified as follows:
Processing temperature: 250 to 550 degrees C., specifically 400 to 500 degrees C.
Processing pressure: 2 to 6 Pa, specifically 2.66 to 5.32 Pa, more specifically 3 to 4 Pa
Supply flow rate of inert gas (for each gas supply pipe): 0.01 to 2 slm
Supply time of inert gas: 1 to 300 seconds, specifically 10 to 60 seconds
RF power: 100 to 1,000 W
RF frequency: 13.56 MHz or 27 MHz By plasma-exciting and supplying the inert gas to the wafer 200 under the aforementioned processing condition, the SiN layer formed on the wafer 200 is modified. At this time, impurities such as Cl remaining in the SiN layer form a gaseous substance containing at least Cl during the process of a modification reaction of the SiN layer by the active species X and are discharged from the process chamber 201. As a result, the SiN layer modified in this step becomes a layer containing fewer impurities such as Cl than the SiN layer formed in step 2. Further, due to this modification, the SiN layer modified in this step is shorter in interatomic distance between Si and N contained in the layer than the SiN layer formed in step 2. As a result, the SiN layer is densified, such that the SiN layer modified in this step is higher in density than the SiN layer formed in step 2.

In a case where the processing pressure is less than 2 Pa, an amount of ions such as $N_2$+, Art, Het generated together with the active species X will rapidly increase when the inert gas is plasma-excited, and excessive ion attack on the wafer 200 may occur, such that the wet etching resistance of the nitride film finally formed on the wafer 200 may deteriorate. By setting the processing pressure to 2 Pa or more, it is possible to reduce the amount of ions generated, suppress the ion attack, and avoid deterioration in the wet etching resistance of the nitride film finally formed on the wafer 200. By setting the processing pressure to 2.66 Pa or more, the above-mentioned effects may be more fully obtained. By setting the processing pressure to 3 Pa or more, the above-mentioned effects may be even more fully obtained.

In a case where the processing pressure exceeds 6 Pa, lifetime of the active species X generated when plasma-exciting the inert gas is shortened, making it difficult for the active species X to reach the center of the wafer 200, such that uniformity of wet etching resistance in the wafer plane of the nitride film finally formed on the wafer 200 may deteriorate. By setting the processing pressure to 6 Pa or less, it is possible to lengthen the lifetime of the active species X, allow the active species X to reach the entire surface of the wafer 200, and avoid deterioration in the uniformity of wet etching resistance in the wafer plane of the nitride film finally formed on the wafer 200. By setting the processing pressure to 5.32 Pa or less, the above-mentioned effects may be more fully obtained. By setting the processing pressure to 4 Pa or less, the above-mentioned effects may be even more fully obtained.

From the above, in this step, the processing pressure may be lowered to 2 Pa or more and 6 Pa or less, specifically 2.66 Pa or more and 5.32 Pa or less, more specifically 3 Pa or more and 4 Pa or less. In this case, the processing pressure in this step may be lower than the processing pressures in steps 1 and 2. Such lowering of the processing pressure may be promoted by setting the flow rate of the inert gas supplied in this step to be lower than the flow rate of the inert gas supplied in the purging. FIG. 5 shows an example in which the lowering of the processing pressure is promoted by setting the flow rate of the inert gas supplied in this step to be lower than the flow rate of the inert gas supplied in the purging.

Due to the modification reaction with the nitriding agent in step 2, a content of impurities such as Cl in the SiN layer formed in step 2 is lower than the content of impurities such as Cl in the Si-containing layer formed in step 1. However, in the SiN layer formed in step 2, impurities such as Cl may remain in an amount of, for example, several atom % without being completely removed by the modification reaction with the nitriding agent. In this step, impurities such as Cl remaining in the SiN layer without being completely removed by the modification reaction performed by using the nitriding agent may be removed by the active species X.

After the modification process of the SiN layer is completed, application of the RF power to the electrode 300 is stopped, and the supply of the plasma-excited inert gas to the wafer 200 is stopped. When the above-described cycle is performed a plurality of times, step 1 is performed again after step 3 is completed, but before that, the interior of the process chamber 201 may be purged under a non-plasma atmosphere. In this case, a gas and the like remaining in the process chamber 201 may be removed from the process chamber 201 (purging) according to the same processing procedure as the purging in step 1. As a result, it is possible to suppress mixing of the plasma-excited inert gas remaining in the process chamber 201 with the precursor supplied into the process chamber 201 in step 1, unintended reactions (e.g., gas phase reaction and plasma vapor phase reaction) resulting from the mixing, and generation of particles, and the like.

Examples of the inert gas may include a nitrogen ($N_2$) gas and rare gases such as an argon (Ar) gas, a helium (He) gas, a neon (Ne) gas, a xenon (Xe) gas, a krypton (Kr) gas, and a radon (Rn). One or more of these gases may be used as the inert gas.

[Performing Cycle Predetermined Number of Times]

By performing a cycle a predetermined number of times (n times, where n is an integer of 1 or more), the cycle including non-simultaneously, that is, without synchronization, performing the above-described steps 1, 2, and 3, for example, a silicon nitride film (SiN film) of a predetermined thickness may be formed as a nitride film on the base which is the surface of the wafer 200. The above-described cycle may be performed a plurality of times. That is, a thickness of the SiN layer formed per cycle may be set to be smaller than a desired film thickness, and the above-described cycle may be performed a plurality of times until the thickness of the SiN film formed by stacking SiN layers reaches the desired film thickness. When a N-, C-, and H-containing gas is used as the nitriding agent, for example, a silicon carbonitride layer (SiCN layer) may also be formed in step 2 and, by performing the above-described cycle a predetermined number of times, for example, a silicon carbonitride film (SiCN film) may also be formed as a nitride film on the surface of the wafer 200.

(After-Purge and Returning to Atmospheric Pressure)

After the process of forming the nitride film of a desired thickness on the wafer 200 is completed, an inert gas is supplied as a purge gas into the process chamber 201 from each of the nozzles 249a to 249c and is exhausted via the exhaust port 231a. Thus, the interior of the process chamber 201 is purged and a gas, reaction by-products, and the like remaining in the process chamber 201 are removed from the process chamber 201 (after-purge). Thereafter, the internal atmosphere of the process chamber 201 is substituted with the inert gas (inert gas substitution) and the internal pressure of the process chamber 201 is returned to the atmospheric pressure (returning to atmospheric pressure).

(Boat Unloading)

Thereafter, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter closing).

(Wafer Cooling)

After the boat unloading, that is, after the shutter closing, the processed wafers 200 are cooled while being supported by the boat 217 until the wafers 200 reach a predetermined temperature at which they may be discharged (wafer cooling).

(Wafer Discharging)

After the wafer cooling, the processed wafers 200 cooled to the predetermined temperature at which the wafers 200 may be discharged is discharged from the boat 217 (wafer discharging).

In this way, a series of processes of forming a film on the wafer 200 are completed. The series of processes are performed a predetermined number of times.

A stress of the nitride film formed on the wafer 200 tends to be a tensile stress. In contrast, according to the embodiments of the present disclosure, by controlling the amount of exposure of the active species X to the surface of the wafer 200 in step 3, it is possible to control the stress of the nitride film formed on the wafer 200 to be between a tensile stress and a compressive stress or control the stress of the nitride film to be the compressive stress.

As exemplified below, the amount of exposure of the active species X to the surface of the wafer 200 in step 3 may be controlled by the time of exposure of the active species X to the surface of the wafer 200 in step 3 or the processing pressure in step 3, at least one of which makes it possible to control the stress of the nitride film formed on the wafer 200, as described above.

For example, by setting the time of exposure of the active species X to the surface of the wafer 200 in step 3 to be longer than the time of exposure of the precursor to the surface of the wafer 200 in step 1, it is possible to appropriately increase the amount of exposure of the active species X to the surface of the wafer 200 in step 3 and control the stress of the nitride film formed on the wafer 200, as described above. Further, for example, by setting the time of exposure of the active species X to the surface of the wafer 200 in step 3 to be longer than the time of exposure of the nitriding agent to the surface of the wafer 200 in step 2, it is possible to appropriately increase the amount of exposure of the active species X to the surface of the wafer 200 in step 3 and control the stress of the nitride film formed on the wafer 200, as described above. Further, for example, by setting the time of exposure of the active species X to the surface of the wafer 200 in step 3 to be longer than the time of purging performed after performing step 1 and before performing step 2, it is possible to appropriately increase the amount of exposure of the active species X to the surface of the wafer 200 in step 3 and control the stress of the nitride film, as described above.

Further, for example, when supplying the active species Y, which is generated by plasma-exciting the nitriding agent, to the wafer 200 in step 2, by setting the amount of exposure of the active species X to the surface of the wafer 200 in step 3 to be larger than the amount of exposure of the active species Y to the surface of the wafer 200 in step 2, it is possible to appropriately increase the amount of exposure of the active species X to the surface of the wafer 200 in step 3 and control the stress of the nitride film formed on the wafer 200, as described above. Further, by setting the time of exposure of the active species X to the surface of the wafer 200 in step 3 to be longer than the time of exposure of the active species Y to the surface of the wafer 200 in step 2, it is possible to appropriately increase the amount of exposure of the active species X to the surface of the wafer 200 in step 3 and control the stress of the nitride film formed on the wafer 200, as described above.

Further, for example, by setting the processing pressure in step 3 to be lower than the processing pressure in step 2, it is possible to lengthen the lifetime of the active species X generated in step 3. As a result, it is possible to appropriately increase the amount of exposure of the active species X to the surface of the wafer 200 in step 3 and control the stress of the nitride film formed on the wafer 200, as described above.

The time of exposure of the active species X to the surface of the wafer 200 in step 3 may be set to be a time at which the stress of the nitride film formed on the wafer 200 is between the tensile stress and the compressive stress or to be a time at which the stress of the nitride film is the compressive stress. Further, the processing pressure in step 3 may be set to a pressure at which the stress of the nitride film formed on the wafer 200 is between the tensile stress and the compressive stress or to a pressure at which the stress of the nitride film is the compressive stress.

(3) Effects of the Embodiments

According to the embodiments of the present disclosure, one or more effects set forth below may be achieved.

(a) By controlling the amount of exposure of the active species X to the surface of the wafer 200 in step 3, it is possible to freely control the stress of the nitride film, which tends to be a tensile stress, to be between the tensile stress and the compressive stress, or control the stress of the nitride film to be the compressive stress. As a result, at various locations in a semiconductor device where various film stresses are demanded, nitride films that meet such a demand may be formed, thereby making it possible to improve device characteristics and performance. Further, since the stress of the nitride film may be freely controlled, it is possible to expand applications to which the nitride film may be applied. Further, since the stress of the nitride film may be freely controlled, it is possible to reduce warp of the wafer 200 after the nitride film is formed, and thus to avoid deterioration in processing accuracy in the subsequent photolithography process, etc.

(b) By setting the time of exposure of the active species X to the surface of the wafer 200 in step 3 to be longer than the time of exposure of the precursor to the surface of the wafer 200 in step 1, it is possible to appropriately increase the amount of exposure of the active species X to the surface of the wafer 200 in step 3, whereby the stress of the nitride film may be controlled with better controllability to be, for example, the compressive stress more effectively.

By setting the time of exposure of the active species X to the surface of the wafer 200 in step 3 to be longer than the time of exposure of the nitriding agent to the surface of the wafer 200 in step 2, it is possible to appropriately increase the amount of exposure of the active species X to the surface of the wafer 200 in step 3, whereby effects which are the same as those described above may be obtained.

By setting the time of exposure of the active species X to the surface of the wafer 200 in step 3 to be longer than the time of purging performed after performing step 1 and before performing step 2, it is possible to appropriately increase the amount of exposure of the active species X to the surface of the wafer 200 in step 3, effects which are the same as those described above may be obtained.

When supplying the active species Y, which is generated by plasma-exciting the nitriding agent, to the wafer 200 in step 2, by setting the amount of exposure of the active species X to the surface of the wafer 200 in step 3 to be larger than the amount of exposure of the active species Y to the surface of the wafer 200 in step 2, it is possible to appropriately increase the amount of exposure of the active species X to the surface of the wafer 200 in step 3, whereby effects which are the same as those described above may be obtained.

When supplying the active species Y, which is generated by plasma-exciting the nitriding agent, to the wafer 200 in step 2, by setting the time of exposure of the active species X to the surface of the wafer 200 in step 3 to be longer than the time of exposure of the active species Y to the surface of the wafer 200 in step 2, it is possible to appropriately increase the amount of exposure of the active species X to the surface of the wafer 200 in step 3, effects which are the same as those described above may be obtained.

By setting the pressure in a space where the wafer 200 is placed in step 3 to be lower than the pressure in the space where the wafer 200 is placed in step 2, it is possible to appropriately increase the amount of exposure of the active species X to the surface of the wafer 200 in step 3, effects which are the same as those described above may be obtained.

(c) The above-described effects are particularly noticeable when the inert gas is at least one selected from the group of $N_2$ gas and rare gas.

Further, the above-described effects are particularly noticeable when the precursor contains halogen and Si and the nitriding agent contains N and H.

Furthermore, the above-described effects are particularly noticeable when the precursor is a halosilane-based gas, the nitriding agent is a hydrogen nitride-based gas, the inert gas is at least one selected from the group of $N_2$ gas and rare gas, and the nitride film is a SiN film.

(4) Modifications

The processing sequence in the embodiments of the present disclosure may be changed as in the following modifications. These modifications may be used in proper combination. Unless otherwise stated, a processing procedure and a processing condition in each step of each modification may be the same as the processing procedure and processing condition in each step of the above-described processing sequence.

First Modification

While setting the amount of exposure (the time of exposure and the processing pressure) of the active species X to the surface of the wafer 200 in step 3 to be different for each predetermined cycle, the stress of the nitride film may be finely regulated in a thickness direction of the nitride film. That is, while setting the amount of exposure of the active species X to the surface of the wafer 200 in step 3 to be different between a cycle in at least one stage selected from the group of an early stage and a late stage of film formation and a cycle in a stage of the film formation other than the selected at least one stage, the stress of the nitride film may be partially finely regulated depending on the stress of the base film of the nitride film or the stress of another film formed on the nitride film (hereinafter also simply referred to as another film).

For example, in step 3, by setting the time of exposure of the active species X to the surface of the wafer 200 in the cycle in the early stage of film formation to be longer than the time of exposure of the active species X to the surface of the wafer 200 in the cycles in other stages (a middle stage and the late stage of film formation), it is possible to control the stress of at least a portion of the nitride film that contacts the base film, to be the compressive stress. Further, for example, in step 3, by setting the processing pressure in the cycle in the early stage of film formation to be lower than the processing pressures in the cycles in other stages (the middle stage and the late stage of film formation), it is possible to control the stress of the nitride film in the same manner as described above. Further, for example, by combining these methods, it is possible to control the stress of the nitride film in the same manner as described above.

This modification may also obtain effects which are the same as those of the above-described embodiments.

Figure 7A:
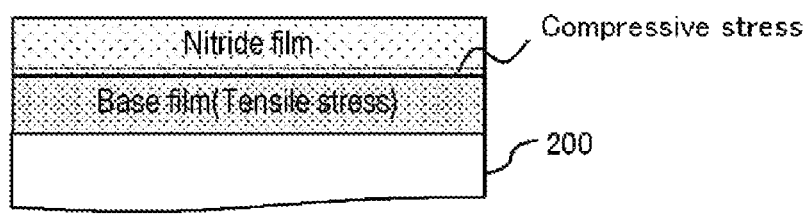
FIG. 7A is a partially enlarged cross-sectional view of a surface of a wafer 200 on which a nitride film in a first modification is formed.

Further, according to this modification, as shown in FIG. 7A, when the stress of the base film of the nitride film is a tensile stress, by controlling the stress of at least a portion of the nitride film that contacts the base film, to be the compressive stress, it is possible to alleviate or cancel out the stress of the base film. Further, it is also possible to reduce the stress of the nitride film itself. Furthermore, it is possible to alleviate the stress of an accumulated film adhering to the interior of the process container, suppress peeling of the accumulated film, and lengthen a maintenance cycle of the film formation apparatus. In addition, when the stress of the base film of the nitride film is a tensile stress, by controlling the stress of the nitride film itself (the entire nitride film) to be the compressive stress, the stress of the base film may also be alleviated or cancelled out.

Second Modification

Similar to the first modification, while setting the amount of exposure (the time of exposure and the processing pressure) of the active species X to the surface of the wafer 200 to be different for each predetermined cycle, the stress of the nitride film may be finely regulated in the thickness direction of the nitride film.

For example, in step 3, by setting the time of exposure of the active species X to the surface of the wafer 200 in a cycle in the late stage of film formation to be longer than the time of exposure of the active species X to the surface of the wafer 200 in cycles in other stages (the early stage and the middle stage of film formation), it is possible to control the stress of at least a portion of the nitride film that contacts another film formed on the nitride film to be the compressive stress. Further, for example, in step 3, by setting the processing pressure in the cycle in the late stage of film formation to be lower than the processing pressures in the cycles in other stages (the early stage and the middle stage of film formation), it is possible to control the stress of the nitride film in the same manner as described above. Further, for example, by combining these methods, it is possible to control the stress of the nitride film in the same manner as described above.

This modification may also obtain effects which are the same as those of the above-described embodiments.

Figure 7B:
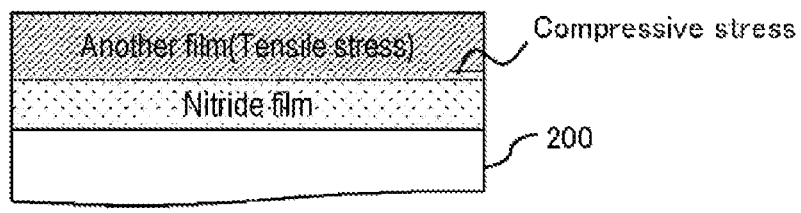
FIG. 7B is a partially enlarged cross-sectional view of a surface of a wafer 200 on which a nitride film in a second modification is formed.

Further, according to this modification, as shown in FIG. 7B, when the stress of another film formed on the nitride film is a tensile stress, by controlling the stress of at least a portion of the nitride film that contacts the another film to be the compressive stress, it is possible to alleviate or cancel out the stress of the another film. Further, it is also possible to reduce the stress of the nitride film itself. Furthermore, it is possible to alleviate the stress of an accumulated film adhering to the interior of the process container, suppress peeling of the accumulated film, and lengthen the maintenance cycle of the film formation apparatus. In addition, when the stress of the another film formed on the nitride film is a tensile stress, by controlling the stress of the nitride film itself (the entire nitride film) to be the compressive stress, the stress of the another film may also be alleviated or cancelled out.

Third Modification

Similar to the first modification, while setting the amount of exposure (the time of exposure and the processing pressure) of the active species X to the surface of the wafer 200 to be different for each predetermined cycle, the stress of the nitride film may be finely regulated in the thickness direction of the nitride film.

For example, in step 3, by setting the time of exposure of the active species X to the surface of the wafer 200 in cycles in the early stage and the late stage of film formation to be longer than the time of exposure of the active species X to the surface of the wafer 200 in a cycle in another stage (the middle stage of film formation), it is possible to control the stress of at least a portion of the nitride film that contacts the base film and the stress of at least a portion of the nitride film that contacts another film formed on the nitride film, to the compressive stress. Further, for example, in step 3, by setting the processing pressure in the cycles in the early stage and the late stage of film formation to be lower than the processing pressure in the cycle in another stage (the middle stage of film formation), it is possible to control the stress of the nitride film in the same manner as described above. Further, for example, by combining these methods, it is possible to control the stress of the nitride film in the same manner as described above.

This modification may also obtain effects which are the same as those of the above-described embodiments.

Figure 7C:
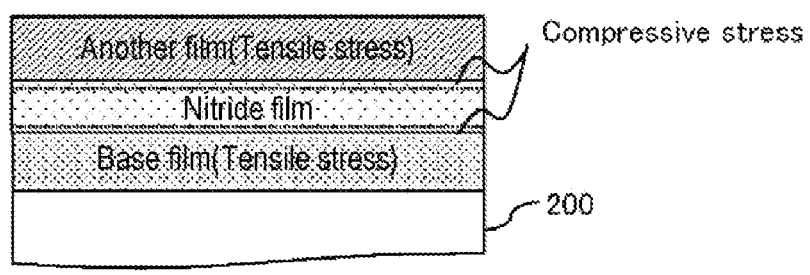
FIG. 7C is a partially enlarged cross-sectional view of a surface of a wafer 200 on which a nitride film in a third modification is formed.

Further, according to this modification, as shown in FIG. 7C, when the stress of the base film of the nitride film is a tensile stress, by controlling the stress of at least a portion of the nitride film that contacts the base film, to the compressive stress, and when the stress of another film formed on the nitride film is a tensile stress, by controlling the stress of at least a portion of the nitride film that contacts the another film to the compressive stress, it is possible to alleviate or cancel out the stress of each of the base film and the another film. Further, it is also possible to reduce the stress of the nitride film itself. Furthermore, it is possible to alleviate the stress of an accumulated film adhering to the interior of the process container, suppress peeling of the accumulated film, and lengthen the maintenance cycle of the film formation apparatus. In addition, when both the stress of the base film of the nitride film and the stress of the another film formed on the nitride film are the tensile stress, by controlling the stress of the nitride film itself (the entire nitride film) to be the compressive stress, the stresses of the base film and the another film may also be alleviated or cancelled out.

Fourth Modification

Similar to the first modification, while setting the amount of exposure (the time of exposure and the processing pressure) of the active species X to the surface of the wafer 200 to be different for each predetermined cycle, the stress of the nitride film may be finely regulated in the thickness direction of the nitride film.

For example, in step 3, by setting the time of exposure of the active species X to the surface of the wafer 200 in cycles in the early stage and the late stage of the film formation to be shorter than the time of exposure of the active species X to the surface of the wafer 200 in a cycle in another stage (the middle stage of film formation), it is possible to control the stress of at least a portion of the nitride film that contacts the base film and the stress of at least a portion of the nitride film that contacts another film formed on the nitride film to the tensile stress. Further, for example, in step 3, by setting the processing pressure in the cycles in the early stage and the late stage of film formation to be higher than the processing pressure in the cycle in another stage (the middle stage of film formation), it is possible to control the stress of the nitride film in the same manner as described above. Further, for example, by combining these methods, it is possible to control the stress of the nitride film in the same manner as described above.

This modification may also obtain effects which are the same as those of the above-described embodiments.

Figure 7D:
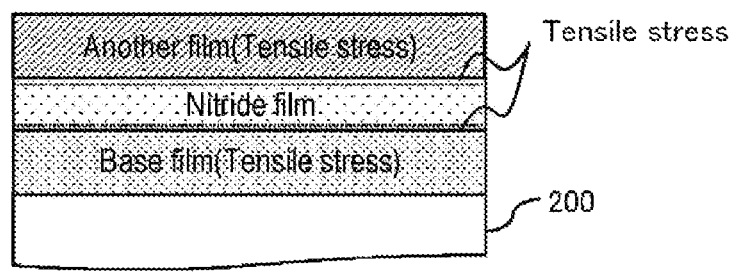
FIG. 7D is a partially enlarged cross-sectional view of a surface of a wafer 200 on which a nitride film in a fourth modification is formed.

Further, according to this modification, as shown in FIG. 7D, when the stress of the base film of the nitride film is a compressive stress, by controlling the stress of at least a portion of the nitride film that contacts the base film to the tensile stress, and when the stress of another film formed on the nitride film is the compressive stress, by controlling the stress of at least a portion of the nitride film that contacts the another film to be the tensile stress, it is possible to alleviate or cancel out the stress of each of the base film and the another film. Further, it is possible to reduce the stress of the nitride film itself. Furthermore, it is possible to alleviate the stress of an accumulated film adhering to the interior of the process container, suppress peeling of the accumulated film, and lengthen the maintenance cycle of the film formation apparatus. In addition, when both the stress of the base film of the nitride film and the stress of the another film formed on the nitride film are the compressive stress, by controlling the stress of the nitride film itself (the entire nitride film) to the tensile stress, the stresses of the base film and the another film may also be alleviated or cancelled out.

Fifth Modification

Similar to the first modification, while setting the amount of exposure (the time of exposure of the active species X in step 3 and the processing pressure in step 3) of the active species X to the surface of the wafer 200 to be different for each predetermined cycle, the stress of the nitride film may be finely regulated in the thickness direction of the nitride film.

For example, in step 3, by gradually lengthening the time of exposure of the active species X to the surface of the wafer 200 for each predetermined cycle from the early stage to the late stage of film formation, it is possible to control the stress of at least a portion (bottom surface side) of the nitride film that contacts the base film to be the tensile stress and control the stress of at least a portion (front surface side) of the nitride film that contacts another film formed on the nitride film to be the compressive stress, such that the stress of the nitride film is capable of being controlled to gradually change from the tensile stress to the compressive stress as it goes from the bottom surface side to the front surface side. Further, for example, in step 3, by gradually lowering the processing pressure for each predetermined cycle from the early stage to the late stage of film formation, it is possible to control the stress of the nitride film in the same manner as described above. Further, for example, by combining these methods, it is possible to control the stress of the nitride film in the same manner as described above.

This modification may also obtain effects which are the same as those of the above-described embodiments.

Figure 7E:
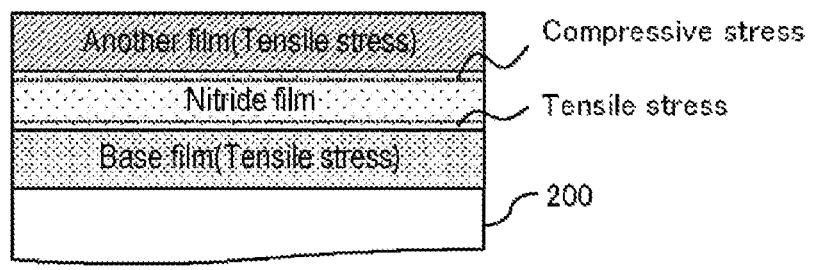
FIG. 7E is a partially enlarged cross-sectional view of a surface of a wafer 200 on which a nitride film in a fifth modification is formed.

Further, according to this modification, as shown in FIG. 7E, by controlling the stress of at least a portion of the nitride film that contacts the base film to be the tensile stress when the stress of the base film of the nitride film is the compressive stress and by controlling the stress of at least a portion of the nitride film that contacts the another film to be the compressive stress when the stress of another film formed on the nitride film is the tensile stress, it is possible to alleviate or cancel out the stress of each of the base film and the another film. Further, it is possible to reduce the stress of the nitride film itself. Furthermore, it is possible to alleviate the stress of an accumulated film adhering to the interior of the process container, suppress peeling of the accumulated film, and lengthen the maintenance cycle of the film formation apparatus.

In this modification, the stress of the nitride film may not be controlled to gradually change from the tensile stress to the compressive stress as it goes from the bottom surface side to the front surface side. When the stress of at least a portion of the nitride film that contacts the base film is the tensile stress and the stress of at least a portion of the nitride film that contacts another film formed on the nitride film is the compressive stress, effects which are the same as those described above may be obtained.

Sixth Modification

Similar to the first modification, the amount of exposure (the time of exposure of the active species X in step 3 and the processing pressure in step 3) of the active species X to the surface of the wafer 200 may be different for each predetermined cycle such that the stress of the nitride film may be finely regulated in the thickness direction of the nitride film.

For example, in step 3, by gradually shortening the time of exposure of the active species X to the surface of the wafer 200 for each predetermined cycle from the early stage to the late stage of film formation, the stress of at least a portion (bottom surface side) of the nitride film that contacts the base film may be controlled to be the compressive stress and the stress of at least a portion (front surface side) of the nitride film that contacts another film formed on the nitride film may be controlled to be the tensile stress, such that the stress of the nitride film is capable of being controlled to gradually change from the compressive stress to the tensile stress as it goes from the bottom surface side to the front surface side. Further, for example, in step 3, by gradually raising the processing pressure for each predetermined cycle from the early stage to the late stage of film formation, it is possible to control the stress of the nitride film in the same manner as described above. Further, for example, by combining these methods, it is possible to control the stress of the nitride film in the same manner as described above.

This modification may also obtain effects which are the same as those of the above-described embodiments.

Figure 7F:
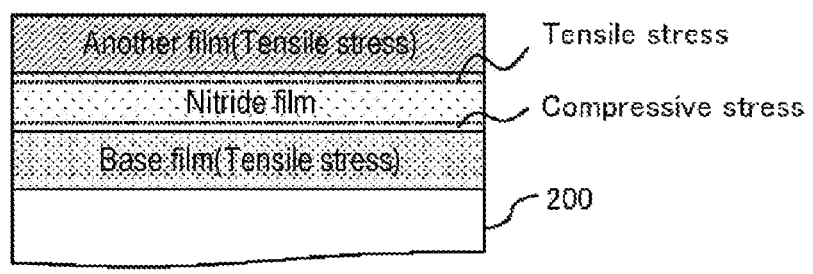
FIG. 7F is a partially enlarged cross-sectional view of a surface of a wafer 200 on which a nitride film in a sixth modification is formed.

Further, according to this modification, as shown in FIG. 7F, by controlling the stress of at least a portion of the nitride film that contacts the base film to be the compressive stress when the stress of the base film of the nitride film is the tensile stress and by controlling the stress of at least a portion of the nitride film that contacts the another film to be the tensile stress when the stress of another film formed on the nitride film is the compressive stress, it is possible to alleviate or cancel out the stress of each of the base film and the another film. Further, it is also possible to reduce the stress of the nitride film itself. Furthermore, it is possible to alleviate the stress of an accumulated film adhering to the interior of the process container, suppress peeling of the accumulated film, and lengthen the maintenance cycle of the film formation apparatus.

In this modification, the stress of the nitride film may not be controlled to gradually change from the compressive stress to the tensile stress as it goes from the bottom surface side to the front surface side. When the stress of at least a portion of the nitride film that contacts the base film is the compressive stress and the stress of at least a portion of the nitride film that contacts another film formed on the nitride film is the tensile stress, effects which are the same as those described above may be obtained.

Seventh Modification

By using the stress control method shown in the above-described modifications, when the stress of the base film of the nitride film is the tensile stress, the stress of at least a portion of the nitride film that contacts the base film may be controlled to be the tensile stress, and when the stress of the base film is the compressive stress, the stress of at least the portion of the nitride film that contacts the base film may be controlled to be the compressive stress.

Further, by using the stress control method shown in the above-described modifications, when the stress of another film formed on the nitride film is the tensile stress, the stress of at least a portion of the nitride film that contacts the another film may be controlled to be the tensile stress, and when the stress of the another films is the compressive stress, the stress of at least the portion of the nitride film that contacts the another film may be controlled to be the compressive stress.

This modification may also obtain effects which are the same as those of the above-described embodiments. Further, according to this modification, since directions of the stress of the nitride film and the stress of the film (base film or another film formed on the nitride film) that contacts the nitride film are aligned, it is possible to suppress occurrence of film peeling due to the stress at an interface between these films.

Eighth Modification

By using a precursor containing Si—N bonds, since the precursor may act as a nitrogen source as well as a Si source, the supply of the nitriding agent may be omitted. That is, in the film-forming process, a SiN film may be formed on the wafer 200 according to the processing sequence shown in FIG. 6 and below.

(Precursor ⟶ P ⟶ Plasma-excited inert gas ⟶ P) × n

In this case, a film may be formed on the wafer 200 by performing a cycle a predetermined number of times, the cycle including:
 (a) a step of supplying the precursor to the wafer 200 in a process container; and
 (c) a step of supplying an active species X, which is generated by plasma-exciting an inert gas, to the wafer 200 in the process container.

Figure 6:
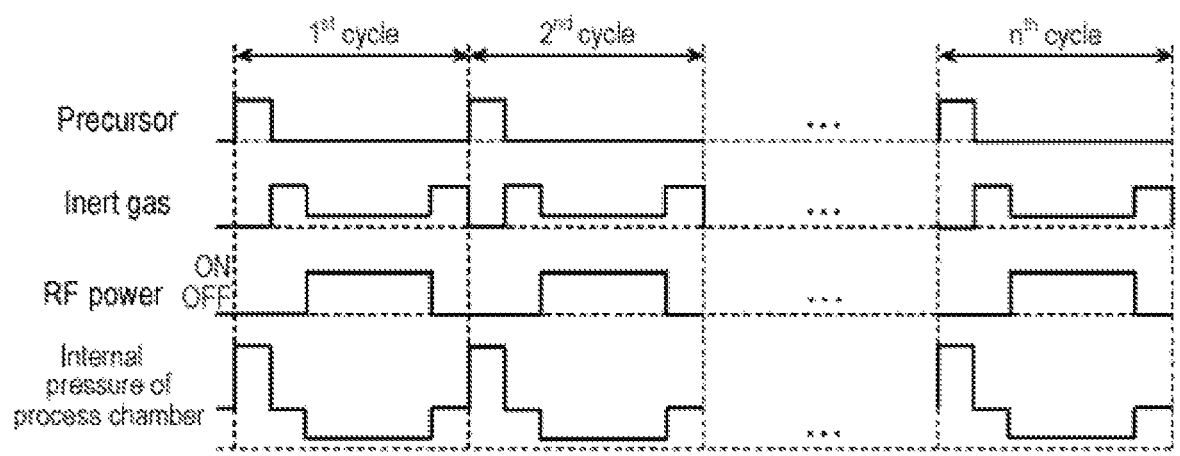
FIG. 6 is a diagram showing an example of a processing sequence in a eighth modification of the present disclosure.

The above-mentioned processing sequence shows an example in which a cycle performing (a) and (c) alternately (non-simultaneously) is performed a predetermined number of times with a step of purging the interior of the process container being sandwiched between (a) and (c). Similar to the above-described embodiments, the purging before and after the supply of the plasma-excited inert gas may be omitted. Further, FIG. 6 shows an example in which the lowering of the processing pressure is promoted by setting the flow rate of the inert gas supplied in (c) to be lower than the flow rate of the inert gas supplied in the purging.

In this case as well, by controlling the amount of exposure of the active species X to the surface of the wafer 200 in (c), the stress of the nitride film may be controlled to be between the tensile stress and the compressive stress or controlled to be the compressive stress.

Examples of the precursor in this modification, that is, the precursor containing Si—N bonds, may include silylamine-based gases such as a monosilylamine ($(SiH_3)NH_2$, abbreviation: MSA) gas, a disilylamine ($(SiH_3)_2NH$, abbreviation: DSA) gas, and a trisilylamine ($(SiH_3)_3N$, abbreviation: TSA) gas. One or more of these gases may be used as the precursor. Among these, TSA containing three Si—N bonds may be used as the precursor. These precursors may be supplied to the wafer 200 from the aforementioned precursor supply system. The processing condition may be the same as that in step 1 of the processing sequence in the above-described embodiments.

As the inert gas in this modification, similar to the inert gas in step 3 of the processing sequence of the above-described embodiments, a $N_2$ gas and rare gases such as an Ar gas, a He gas, a Ne gas, and a Xe gas may be used. One or more of these gases may be used as the inert gas. In this modification, among these gases, the $N_2$ gas may be used as the inert gas. These inert gases may be supplied to the wafer 200 from the above-mentioned inert gas supply system. The processing condition may be the same as that in step 3 of the processing sequence in the above-described embodiments.

This modification may also obtain effects which are the same as those of the above-described embodiments. Further, according to this modification, the supply of the nitriding agent may be omitted, making it possible to shorten the processing time. As a result, it is possible to improve a throughput, that is, productivity.

Ninth Modification

As in the processing sequence shown below, in (b), the nitriding agent may be supplied without being plasma-excited.

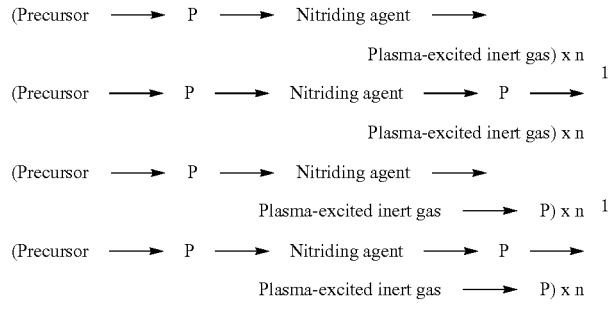

This modification may also obtain effects which are the same as those of the above-described embodiments.

Tenth Modification

The above-described cycle may further include a step of supplying an oxidizing agent to the wafer 200. In this case, it is possible to form a silicon oxynitride film (SiON film) on the wafer 200. In such a case, the oxidizing agent may be supplied to the wafer 200 without or with being plasma-excited. That is, in the film-forming process, the SiON film may be formed on the wafer 200 according to the process sequences shown below. Similar to the above-described embodiments, the purging before and after the supply of the plasma-excited inert gas may be omitted.

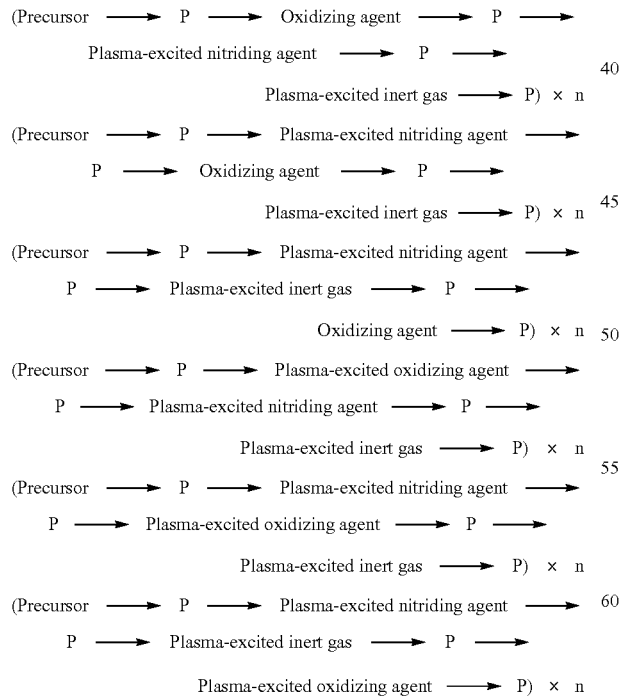

In these cases, the oxidizing agent may be supplied to the wafer 200 from the above-mentioned oxidizing agent supply system. Further, the processing condition may be the same as that in step 2 of the processing sequence in the above-described embodiments. Further, a hydrogen (H)-containing gas may be supplied together with the oxidizing agent. The H-containing gas may be supplied, for example, from the precursor supply system or the nitriding agent supply system.

Examples of the oxidizing agent may include an oxygen ($O_2$) gas, an ozone ($O_3$) gas, water vapor ($H_2O$ gas), a hydrogen peroxide ($H_2O_2$) gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas, and the like. One or more of these gases may be used as the oxidizing agent.

When supplying the H-containing gas together with the oxidizing agent, for example, a hydrogen ($H_2$) gas, a deuterium ($^2H_2$) gas, or the like may be used as the H-containing gas. The $^2H_2$ gas is also referred to as a $D_2$ gas. One or more of these gases may be used as the H-containing gas.

This modification may also obtain effects which are the same as those of the above-described embodiments. That is, even when the cycle further includes the step of supplying the oxidizing agent to the wafer 200 and the SiON film is formed on the wafer 200, the effects which are the same as those in the above-described embodiments may be obtained.

Further, the above-described cycle in the eighth modification may further include a step of supplying an oxidizing agent to the wafer 200. In this case as well, it is possible to form a SiON film on the wafer 200. In that case, the oxidizing agent may be supplied to the wafer 200 without or with being plasma-excited. That is, in the film-forming process, the SiON film may be formed on the wafer 200 according to the process sequences shown below. In this case as well, similar to the above-described embodiments, the purging before and after the supply of the plasma-excited inert gas may also be omitted.

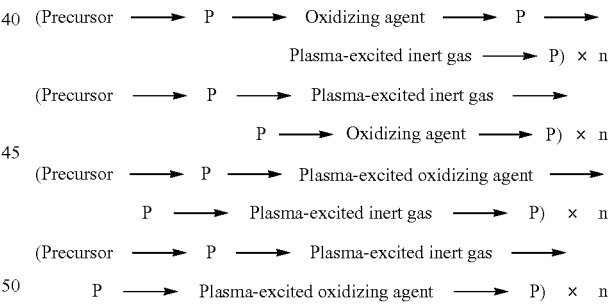

In these cases as well, effects which are the same as those in the above-described embodiments and the eighth modification may be obtained. That is, even when the cycle further includes the step of supplying the oxidizing agent to the wafer 200 and the SiON film is formed on the wafer 200, effects which are the same as those in the above-described embodiments and the eighth modification may be obtained.

Other Embodiments of the Present Disclosure

The embodiments of the present disclosure are specifically described above. However, the present disclosure is not limited to the above-described embodiments, and various changes may be made without departing from the gist thereof.

For example, in addition to performing a cycle including steps 1, 2, and 3 in this order a predetermined number of times (n times, where n is an integer of 1 or more) as in the processing sequence in the above-described embodiments, the order in which each step is performed may be changed as in the processing sequences shown below. In these cases as well, effects which are the same as those in the above-described embodiments may be obtained.

(Step 1 ⟶ Step 2 ⟶ Step 3) × n (Step 2 ⟶ Step 3 ⟶ Step 1) × n (Step 3 ⟶ Step 1 ⟶ Step 2) × n However, when the last step in the cycle is step 1 or step 2, composition and modification effect of the outermost surface of the finally formed film may be different from those of other portions. Therefore, as in the processing sequences shown below, a film quality of the outermost surface of the finally formed film may be finely regulated by performing steps 2 and 3 after the final cycle is completed such that a state of nitridation by step 2 and a state of modification by step 3 are equal to those of a layer formed up to that point.

(Step 2 ⟶ Step 3 ⟶ Step 1) × n ⟶ Step 2 ⟶ Step 3

(Step 3 ⟶ Step 1 ⟶ Step 2) × n ⟶ Step 3

Further, for example, in addition to performing a cycle including steps 1, 2, and 3 a predetermined number of times (n times, where n is an integer of 1 or more) as in the processing sequence in the above-described embodiments, a cycle in which step 3 is performed after steps 1 and 2 are performed a plurality of times (m times, where m is an integer of 2 or more) may be performed a predetermined number of times (n times, where n is an integer of 1 or more). Alternatively, a cycle in which steps 2 and 3 are performed a plurality of times (m times, where m is an integer of 2 or more) after step 1 is performed may be performed a predetermined number of times (n times, where n is an integer of 1 or more). These processing sequences may be expressed as below. In these cases as well, effects which are the same as those in the above-described embodiments may be obtained.

(Step 1 ⟶ Step 2 ⟶ Step 3) × n

[(Step 1 ⟶ Step 2) × m ⟶ Step 3] × n

[(Step 1 ⟶ (Step 2 ⟶ Step 3) × m] × n

Further, for example, as a plasma generation method, in addition to the capacitively-coupled plasma (abbreviation: CCP), inductively-coupled plasma (abbreviation: ICP) may be used. In this case as well, effects which are the same as those in the above-described embodiments may be obtained.

Recipes used in each process may be provided individually according to the processing contents and may be recorded and stored in the memory 121*c* via a telecommunication line or the external memory 123. Moreover, at the beginning of each process, the CPU 121*a* may properly select an appropriate recipe from the recipes recorded and stored in the memory 121*c* according to the processing contents. Thus, it is possible for a single film formation apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the film formation apparatus. Once the recipes are modified, the modified recipes may be installed in the film formation apparatus via a telecommunication line or a recording medium storing the recipes. In addition, the existing recipes already installed in the existing film formation apparatus may be directly modified by operating the input/output device 122 of the film formation apparatus.

Examples in which a film is formed by using a batch-type film formation apparatus capable of processing a plurality of substrates at a time are described in the above-described various embodiments and modifications. The present disclosure is not limited to the above-described various embodiments and modifications, but may be suitably applied, for example, to a case where a film is formed by using a single-wafer type film formation apparatus configured to process a single substrate or several substrates at a time. In addition, examples in which a film is formed by using a film formation apparatus including a hot-wall-type process furnace are described in the above-described various embodiments and modifications. The present disclosure is not limited to the above-described various embodiments and modifications, but may be suitably applied to a case where a film is formed by using a film formation apparatus including a cold-wall-type process furnace.

Even in the case of using these film formation apparatuses, the respective processes may be performed according to processing procedures and processing conditions which are the same as those in the above-described various embodiments and modifications, and effects which are the same as those in the above-described various embodiments and modifications may be obtained.

The above-described various embodiments and modifications may be used in proper combination. Processing procedures and processing conditions used in this case may be the same as, for example, those in the above-described various embodiments and modifications.

Examples

As Examples 1 to 3, by using the film forming apparatus in the above-described embodiments, SiN films are formed on wafers according to a processing sequence in which a cycle including steps 1 to 3 is performed a predetermined number of times. A DCS gas is used as a precursor, a $NH_3$ gas is used as a nitriding agent, and a $N_2$ gas is used as an inert gas. A supply time of active species X in step 3 is set to 5 seconds, 20 seconds, and 60 seconds in this order. Other processing conditions are common conditions within a range of processing conditions in the above-described embodiments.

As Comparative Example, by using the film-forming apparatus in the above-described embodiments, a SiN film is formed on a wafer according to a processing sequence in which steps 1 and 2 are performed alternately a predetermined number of times. In Comparative Example, step 3 is not performed. A DCS gas is used as a precursor, and a $NH_3$ gas is used as a nitriding agent. Processing conditions are the same as those in Examples.

Figure 8:
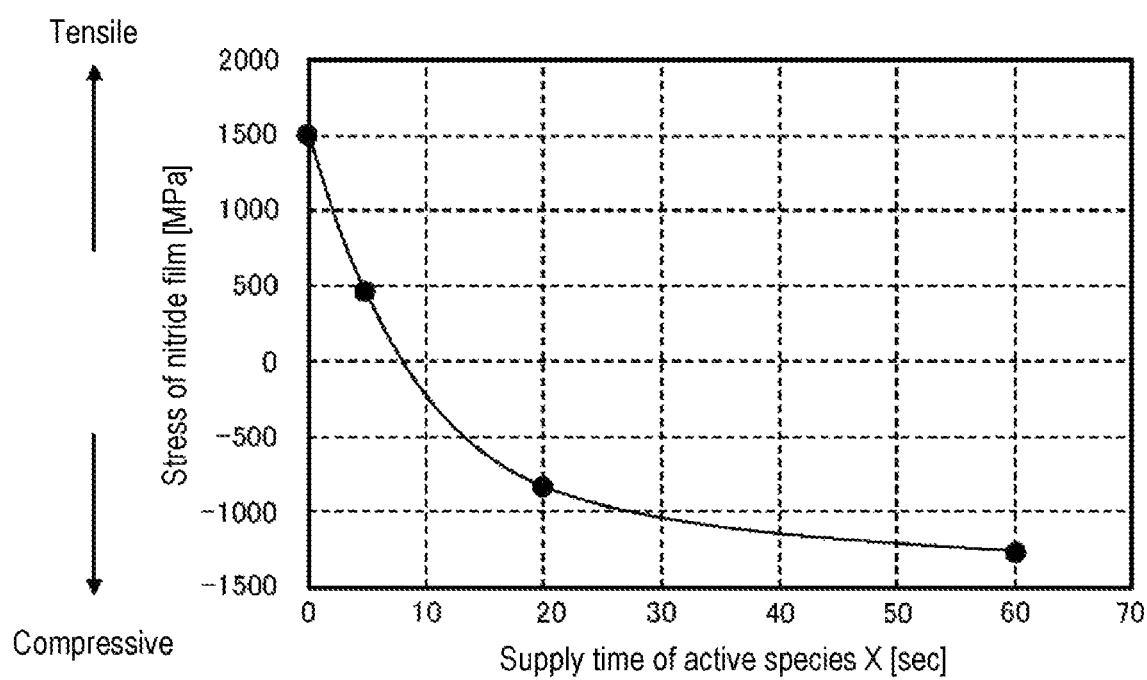
FIG. 8 is a diagram showing measurement results of stresses on nitride films in Example and Comparative Examples.

Then, stresses of the SiN films in Examples 1 to 3 and Comparative Example are measured respectively. The results are shown in FIG. 8. In FIG. 8, a horizontal axis represents a supply time (seconds) of active species X in step 3, and a vertical axis represents a stress [MPa] of the SiN film. Note that 0 seconds on the horizontal axis means that step 3 is not performed (Comparative Example). Moreover, on the vertical axis, a positive stress means a tensile stress, and a negative stress means a compressive stress.

As shown in FIG. 8, it may be confirmed that the stress of the SiN film in Comparative Example (the supply time of active species X: 0 seconds) is a tensile stress of about 1,500 MPa. In contrast, it may be confirmed that the stresses of the SiN films in Examples 1 to 3 are, in this order, a tensile stress of about 500 MPa, a compressive stress of about 800 MPa, and a compressive stress of about 1,250 MPa. That is, it may be confirmed that by performing step 3 and controlling the amount of exposure of the active species X to the surfaces of the wafers in step 3, it is possible to control the stress of the SiN film to be between the tensile stress and the compressive stress or control the stress of the SiN film to be the compressive stress.

Embodiments of the Present Disclosure

Other embodiments of the present disclosure will be described below in the form of supplementary notes.
(Supplementary Note 1)
According to other embodiments of the present disclosure, there is provided a method of forming a film or a method of manufacturing a semiconductor device, including:
a step of forming a nitride film on a substrate by performing a cycle a predetermined number of times, the cycle including:
(a) a step of supplying a precursor to the substrate; and
(c) a step of supplying an active species X which is generated by plasma-exciting an inert gas, to the substrate,
wherein a stress of the nitride film is controlled to be between a tensile stress and a compressive stress or is controlled to be the compressive stress by controlling an amount of exposure of the active species X to the surface of the substrate in (c).
(Supplementary Note 2)
According to other embodiments of the present disclosure, there is provided a film formation apparatus including:
a process chamber in which a substrate is processed;
a precursor supply system configured to supply a precursor to the substrate in the process chamber;
an inert gas supply system configured to supply an inert gas to the substrate in the process chamber;
an exciter configured to plasma-excite a gas; and
a controller configured to be capable of controlling the precursor supply system, the inert gas supply system, and the exciter so as to perform each process (each step) in Supplementary Note 1 in the process chamber.
(Supplementary Note 3)
According to other embodiments of the present disclosure, there is provided a program that causes, by a computer, a film formation apparatus to perform each procedure (each step) in Supplementary Note 1, or a computer-readable recording medium storing the program.

According to the present disclosure in some embodiments, it is possible to improve a controllability of a stress of a nitride film While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a film, comprising:
forming a nitride film on a substrate by performing a cycle a predetermined number of times, the cycle including non-simultaneously performing:
(a) supplying a precursor to the substrate;
(b) supplying a nitriding agent containing hydrogen to the substrate; and
(c) supplying an active species X, which is generated by plasma-exciting an inert gas, to the substrate from an outer peripheral side of the substrate without supplying any gas other than the inert gas to the substrate,
wherein a pressure in a space where the substrate is placed in (c) is set to be lower than a pressure in the space where the substrate is placed in (b), and
wherein a stress of the nitride film is controlled to be between a tensile stress and a compressive stress or is controlled to be the compressive stress by controlling an amount of exposure of the active species X to a surface of the substrate in (c).

2. The method of claim 1, wherein the stress of the nitride film is controlled to be the compressive stress by controlling a time of exposure of the active species X to the surface of the substrate in (c).

3. The method of claim 1, wherein a time of exposure of the active species X to the surface of the substrate in (c) is set to be longer than a time of exposure of the precursor to the surface of the substrate in (a).

4. The method of claim 1, wherein a time of exposure of the active species X to the surface of the substrate in (c) is set to be longer than a time of exposure of the nitriding agent to the surface of the substrate in (b).

5. The method of claim 1, wherein the cycle further includes:
purging the space where the substrate is placed, after performing (a) and before performing (b),
wherein a time of exposure of the active species X to the surface of the substrate in (c) is set to be longer than a time of the purging.

6. The method of claim 1, wherein in (b), an active species Y generated by plasma-exciting the nitriding agent is supplied to the substrate.

7. The method of claim 6, wherein the amount of exposure of the active species X to the surface of the substrate in (c) is set to be larger than an amount of exposure of the active species Y to the surface of the substrate in (b).

8. The method of claim 1, wherein a time of exposure of the active species X to the surface of the substrate in (c) is set to be a time during which the stress of the nitride film is the compressive stress.

9. The method of claim 1, wherein the pressure in the space where the substrate is placed in (c) is set to 2 Pa or more and 6 Pa or less.

10. The method of claim 1, wherein a time of exposure of the active species X to the surface of the substrate in (c) is set to be different for each predetermined cycle.

11. The method of claim 1, wherein the forming the film includes an early stage, a middle stage, and a late stage, and
wherein a time of exposure of the active species X to the surface of the substrate in (c) is set to be different between (i) a cycle in at least one stage selected from the group of the early stage and the late stage and (ii) a cycle in a stage of the forming the film other than the selected at least one stage.

12. The method of claim 1, wherein when a stress of a base film of the nitride film is the tensile stress, a stress of at least a portion of the nitride film that contacts the base film is controlled to be the compressive stress, and
wherein when the stress of the base film is the compressive stress, the stress of the at least a portion of the nitride film that contacts the base film is controlled to be the tensile stress.

13. The method of claim 1, wherein when a stress of another film formed on the nitride film is the tensile stress, a stress of at least a portion of the nitride film that contacts the another film is controlled to be the compressive stress, and
wherein when the stress of the another film is the compressive stress, the stress of the at least a portion of the nitride film that contacts the another film is controlled to be the tensile stress.

14. The method of claim 1, wherein the inert gas is at least one selected from the group of a $N_2$ gas and a rare gas.

15. The method of claim 1, wherein the precursor contains halogen and silicon, and the nitriding agent contains nitrogen and hydrogen.

16. The method of claim 1, wherein the precursor is a halosilane-based gas, the nitriding agent is a hydrogen nitride-based gas, the inert gas is at least one selected from the group of a $N_2$ gas and a rare gas, and the nitride film is a silicon nitride film.

17. A method of manufacturing a semiconductor device, comprising the method of claim 1.

18. The method of claim 1, wherein the cycle further includes:
(d) purging the space where the substrate is placed with supplying the inert gas to the substrate, after performing (a) and before performing (b), and
wherein a flow rate of the inert gas supplied into the space where the substrate is placed in (c) is set to be smaller than a flow rate of the inert gas in (d).

19. The method of claim 1, wherein a pressure in the space where the substrate is placed in (b) is set to 20 Pa or more and 70 Pa or less, and a pressure in the space where the substrate is placed in (c) is set to 2.66 Pa or more and 5.32 Pa or less.

20. The method of claim 1, wherein, in (b), the nitriding agent is supplied to the substrate without being plasma-excited.

21. The method of claim 1, wherein a pressure in the space where the substrate is placed in (c) is set to be different for each predetermined cycle.

22. A film formation apparatus comprising:
a precursor supply system configured to supply a precursor to a substrate;
a nitriding agent supply system configured to supply a nitriding agent containing hydrogen to the substrate;
an inert gas supply system configured to supply an inert gas to the substrate;
an exciter configured to plasma-excite a gas; and
a controller configured to be capable of controlling the precursor supply system, the nitriding agent supply system, the inert gas supply system, and the exciter so as to perform a process including:
forming a nitride film on the substrate by performing a cycle a predetermined number of times, the cycle including non-simultaneously performing:
(a) supplying the precursor to the substrate;
(b) supplying the nitriding agent to the substrate; and
(c) supplying an active species X, which is generated by plasma-exciting the inert gas, to the substrate from an outer peripheral side of the substrate without supplying any gas other than the inert gas to the substrate,
wherein a pressure in a space where the substrate is placed in (c) is set to be lower than a pressure in the space where the substrate is placed in (b), and
wherein a stress of the nitride film is controlled to be between a tensile stress and a compressive stress or is controlled to be the compressive stress by controlling an amount of exposure of the active species X to a surface of the substrate in (c).

23. A non-transitory computer-readable recording medium storing a program that causes, by a computer, a film formation apparatus to perform a process comprising:
forming a nitride film on a substrate by performing a cycle a predetermined number of times, the cycle including non-simultaneously performing:
(a) supplying a precursor to the substrate;
(b) supplying a nitriding agent containing hydrogen to the substrate; and
(c) supplying an active species X, which is generated by plasma-exciting an inert gas, to the substrate from an outer peripheral side of these substrate without supplying any gas other than the inert gas to the substrate,
wherein a pressure in a space where the substrate is placed in (c) is set to be lower than a pressure in the space where the substrate is placed in (b), and
wherein a stress of the nitride film is controlled to be between a tensile stress and a compressive stress or is controlled to be the compressive stress by controlling an amount of exposure of the active species X to a surface of the substrate in (c).

* * * * *